(12) United States Patent
Oh et al.

(10) Patent No.: US 12,550,589 B2
(45) Date of Patent: Feb. 10, 2026

(54) DISPLAY DEVICE INCLUDING A SEALANT AND A FILLER BETWEEN SUBSTRATES AND AN ELECTRONIC DEVICE INCLUDING THE SAME

(71) Applicant: SAMSUNG DISPLAY CO., LTD., Yongin-si (KR)

(72) Inventors: So Young Oh, Hwaseong-si (KR); Jae Heung Ha, Suwon-si (KR); Won Jong Kim, Suwon-si (KR); Jong Woo Kim, Hwaseong-si (KR); Hee Yeon Park, Seoul (KR); Chang Yeong Song, Suwon-si (KR); Hye In Yang, Siheung-si (KR); Woo Suk Jung, Yongin-si (KR); Yong Chan Ju, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 600 days.

(21) Appl. No.: 17/664,612

(22) Filed: May 23, 2022

(65) Prior Publication Data

US 2023/0108432 A1    Apr. 6, 2023

(30) Foreign Application Priority Data

Sep. 30, 2021    (KR) .................. 10-2021-0130067

(51) Int. Cl.
*H10K 59/80*    (2023.01)
*H10K 71/00*    (2023.01)

(52) U.S. Cl.
CPC ......... *H10K 59/8722* (2023.02); *H10K 71/00* (2023.02)

(58) Field of Classification Search
CPC ..................... H10K 50/8426; H10K 71/00
USPC .................................. 257/40, 59, 99
See application file for complete search history.

(56) References Cited

U.S. PATENT DOCUMENTS

| | | | |
|---|---|---|---|
| 8,188,509 B2 | 5/2012 | Lee | |
| 8,357,929 B2 | 1/2013 | Ryu et al. | |
| 9,985,244 B2 | 5/2018 | Luo et al. | |
| 10,290,828 B2 | 5/2019 | Li et al. | |
| 2004/0232833 A1* | 11/2004 | Menda | H10K 59/874 |
| | | | 313/511 |

(Continued)

FOREIGN PATENT DOCUMENTS

| | | |
|---|---|---|
| KR | 10-0879864 | 1/2009 |
| KR | 10-2010-0106796 A | 10/2010 |

OTHER PUBLICATIONS

Office action dated Dec. 19, 2024, in corresponding Korean Patent Application No. 10-2021-0130067, 5 pages.

*Primary Examiner* — Eric W Jones
(74) *Attorney, Agent, or Firm* — F. CHAU & ASSOCIATES, LLC

(57) ABSTRACT

A display device includes a first substrate, a second substrate disposed on the first substrate, a display disposed on the first substrate, a sealant disposed between the first substrate and the second substrate along an outer portion of the second substrate and attaching the first substrate to the second substrate together, and a filler disposed in a space defined by the first substrate, the second substrate and the sealant. The filler is spaced apart from an inner surface of the sealant with an empty space disposed therebetween. An edge of the filler is inclined with respect to a first surface of the second substrate.

11 Claims, 33 Drawing Sheets

(56) References Cited

U.S. PATENT DOCUMENTS

| | | | |
|---|---|---|---|
| 2007/0170849 A1* | 7/2007 | Park | H10K 50/844 |
| | | | 313/506 |
| 2010/0060158 A1* | 3/2010 | Kase | H10K 50/8426 |
| | | | 445/25 |
| 2017/0279076 A1* | 9/2017 | Song | H10K 59/8722 |
| 2019/0311671 A1* | 10/2019 | Yeum | H10K 50/8426 |

* cited by examiner

DISPLAY DEVICE INCLUDING A SEALANT AND A FILLER BETWEEN SUBSTRATES AND AN ELECTRONIC DEVICE INCLUDING THE SAME

This application claims priority under 35 USC § 119 to Korean Patent Application No. 10-2021-0130067, filed on Sep. 30, 2021 in the Korean Intellectual Property Office, the disclosure of which is herein incorporated by reference in its entirety.

TECHNICAL FIELD

The disclosure relates to a display device and, more particularly, to a display device including a sealant and a method of fabricating the same.

DISCUSSION OF THE RELATED ART

Display devices are used in a multitude of electronic devices and so a wide range of display devices have been developed to meet the needs of modern electronic devices. For example, display devices such as liquid-crystal display (LCD) devices and organic light-emitting diode (OLED) display devices are currently being developed.

Among display devices, an OLED display device includes organic light-emitting elements which are self-luminous elements. An organic light-emitting element may include two opposing electrodes and an organic emissive layer interposed therebetween. Electrons and holes supplied from the two electrodes are recombined in the emissive layer to generate excitons, the generated excitons relax from the excited state to the ground state and the dissipated energy is emitted as light.

Some display devices include two opposing substrates. The two substrates may be attached together using a sealant. The space between the two substrates may be filled with a filler.

SUMMARY

A display device includes a first substrate, a second substrate disposed on the first substrate, a display disposed on the first substrate, a sealant disposed between the first substrate and the second substrate along an outer portion of the second substrate and attaching the first substrate to the second substrate together, and a filler disposed in a space defined by the first substrate, the second substrate and the sealant. The filler is spaced apart from an inner surface of the sealant with an empty space disposed therebetween. An edge of the filler is inclined with respect to a first surface of the second substrate.

The edge of the filler may include a first edge that is in contact with a first surface of the first substrate and a second edge that is in contact with the first surface of the second substrate. A distance between the inner surface of the sealant and the first edge may be greater than a distance between the inner surface of the sealant and the second edge.

Each of the first edge and the second edge of the filler may have a closed curved shape. The first edge may be disposed closer to a center of the display device than is the second edge.

The first edge and the second edge may each have a uniform distance along a border of the filler.

The second edge may include a curved extension. An offset of the curved extension may be greater than an offset of the inner surface of the sealant adjacent thereto.

The empty space may be in a vacuum state, may be filled with a gas, or may be an air gap.

The filler may have a viscosity that is equal to or greater than 10,000 cP.

A display device includes a first substrate, a second substrate disposed on the first substrate, a display disposed on the first substrate, a filler disposed between the first substrate and the second substrate and covering the display and surrounding a side surface of the display, and a sealant disposed between the first substrate and the second substrate and surrounding the filler. An edge of the filler includes a first edge that is in contact with the first substrate and a second edge that is in contact with the second substrate. The first edge is disposed closer to a center of the display device than is the second edge. The second edge is spaced apart from the sealant.

A space between the second edge and the sealant may be in a vacuum state, may be filled with a gas, or may be an air gap.

The second edge may have a curved extension. An offset of the curved extension may be greater than an offset of an inner surface of the sealant adjacent thereto.

A method of fabricating a display device includes preparing a first substrate and a second substrate. The first substrate includes a display disposed on a first surface thereof. A sealant is applied along an outer portion on a first surface of the second substrate. A first filling material having a first density is applied to an edge of the first surface of the second substrate exposed through an inner space of the sealant. A second filling material having a second density that is greater than the first density is applied to a central portion of the first surface of the second substrate exposed through the inner space of the sealant. The first substrate is brought into contact with the second substrate such that the first surface of the first substrate faces the first surface of the second substrate.

The applying of the first filling material may include applying the first filling material in the form of droplets that are spaced apart from one another, and the applying of the second filling material may include applying the second filling material in the form of droplets that are spaced apart from one another.

The method fabricating a display device may further include curing the first filling material and the second filling material after the bringing the first substrate and the second substrate into contact with one another.

The method fabricating a display device may further include curing the sealant after the bringing the first substrate and the second substrate into contact with one another and before the curing of each of the first filling material and the second filling material.

The applying of the second filling material may be performed after the applying of the first filling material.

The method fabricating a display device may further include pre-curing the first filling material after the applying of the first filling material and before the applying of the second filling material.

After the curing of the first filling material, an edge of the first filling material may be spaced apart from an inner surface of the sealant. The edge of the first filling material may be inclined with respect to the first surface of the second substrate.

The applying of the first filling material may include applying a first amount of the first filling material. The applying of the second filling material may include applying a second amount of the second filling material. The second amount may be larger than the first amount.

The first filling material and the second filling material may be made of a same material.

The applying of the first filling material and the applying of the second filling material may be performed using a jet dispenser.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Embodiments of the invention will now be described more fully hereinafter with reference to the accompanying drawings. This invention may, however, be embodied in different forms and is not necessarily limited to the embodiments set forth herein.

It will also be understood that when a layer is referred to as being "on" another layer or substrate, it can be directly on the other layer or substrate, or intervening layers may also be. The same reference numbers may indicate the same components throughout the specification and the drawings.

It will be understood that, although the terms "first," "second," etc. may be used herein to describe various elements, these elements should not necessarily be limited by these terms. These terms are used to distinguish one element from another element. For instance, a first element discussed below could be termed a second element without departing from the teachings of the invention. Similarly, the second element could also be termed the first element.

Hereinafter, embodiments of the disclosure will be described in detail with reference to the accompanying drawings.

Figure 1:
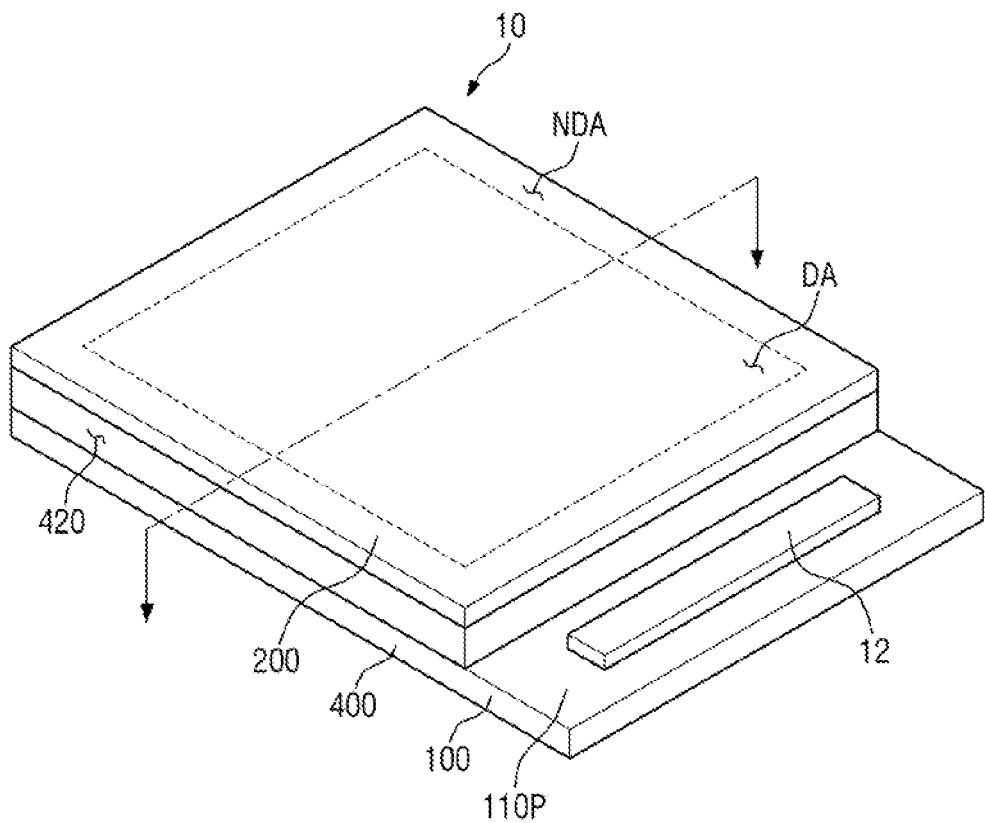
FIG. 1 is a perspective view of a display device according to an embodiment of the disclosure.
Figure 2:
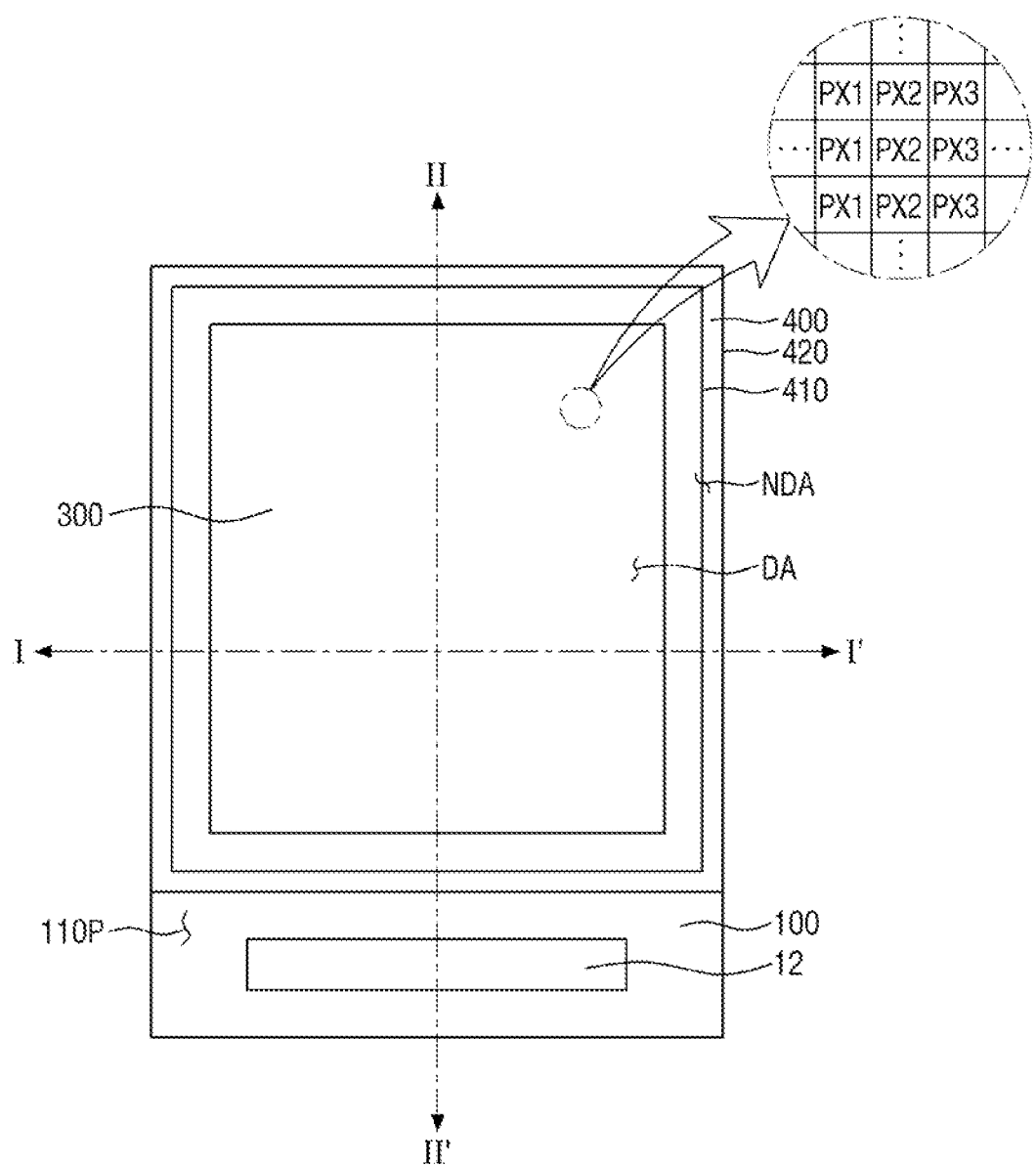
FIG. 2 is a plan view of a display device according to an embodiment of the disclosure.

FIG. 1 is a perspective view of a display device according to an embodiment of the disclosure. FIG. 2 is a plan view of a display device according to an embodiment of the disclosure.

A display device 1 shown in FIGS. 1 and 2 may be employed in a variety of electronic devices including small- and-medium sized electronic devices such as a tablet PC, a smartphone, a vehicle navigation unit, a camera, a center information display (CID) installed in vehicles, a wrist-type electronic device, a personal digital assistant (PMP), a portable multimedia player (PMP) and a game machine, and medium-and-large electronic devices such as a television, an electric billboard, a monitor, a personal computer and a laptop computer. It should be understood that the above-listed electronic devices are merely illustrative and the display device 10 may be employed in a variety of other electronic devices without departing from the scope of the disclosure.

In some embodiments, the display device 10 may have a substantially rectangular shape when viewed from the top. The display device 10 may have two shorter sides extended in a first direction, and two longer sides extended in a second direction crossing the first direction. Although the corners where the longer sides and the shorter sides of the display device 10 meet may form right angles, this is merely illustrative. The display device 10 may have rounded corners. The shape of the display device 10 when viewed from the top is not necessary limited to that shown in the drawings. The display device 10 may have a substantially square shape, a substantially circular shape, a substantially elliptical shape, or other shapes.

The display device 10 may include a display area DA where images are displayed, and a non-display area NDA where no image is displayed.

The display area DA may be disposed in the central portion of display device 10. The display area DA may include a plurality of pixels PX. The plurality of pixels PX may include first pixels PX1 emitting light of a first color (e.g., red light having a peak wavelength in the range of approximately 610 nm to 650 nm), second pixels PX2 emitting light of a second color (e.g., green light having a peak wavelength in the range of approximately 510 nm to 550 nm), and third pixels PX3 emitting light of a third color (e.g., blue light having a peak wavelength in the range of approximately 430 nm to 470 nm). The first pixels PX1, the second pixels PX2 and the third pixels PX3 may be arranged repeatedly in a matrix pattern. The pixels PX1, PX2 and PX3 may be arranged in a variety of ways such as stripes and PenTile patterns. In addition, each of the pixels may include at least one light-emitting element that emits light of a particular wavelength range to provide a particular color.

The non-display area NDA may be disposed on the outer side of the display area DA. Although the display area DA is formed in a rectangular shape and the non-display area NDA surrounds all of the edges of the display area DA in the drawings, the disclosure is not necessarily limited thereto.

The non-display area NDA may be omitted from one or more edges of the display area DA.

The display device 10 may include a display panel and a driver circuit 12.

The display panel may include a first substrate 100, a second substrate 200 disposed on the first substrate 100, a display 300 disposed on the first substrate 100, a sealant 400 disposed between the first substrate 100 and the second substrate 200 along their outer position (or edges), and a filling material 500 (see FIG. 3) used to fill the space between the first substrate 100 and the second substrate 200.

The first substrate 100 supports the display 300. The first substrate 100 may be formed of a polymer material including glass or plastic. The first substrate 100 may be transparent, however, the disclosure is not necessarily limited thereto. According to this embodiment, a transparent glass substrate is employed as the first substrate 100.

The second substrate 200 is disposed on the first substrate 100. The second substrate 200 may include, but is not necessarily limited to including, transparent glass. For example, transparent plastic may be employed as the second substrate 200.

The first substrate 100 and the second substrate 200 are disposed parallel to each other. The surfaces of the first substrate 100 and the second substrate 200 that face each other are referred to as first surfaces while the opposite surfaces are referred to as second surfaces. The first surface 110 of the first substrate 100 and the first surface 210 of the second substrate 200 may be parallel to one another, and the distance therebetween may be substantially uniform. The first substrate 100 and the second substrate 200 may have a substantially uniform thickness, and accordingly, the second surface of the first substrate 100 and the second surface of the second substrate 200 may also be disposed in parallel to each other.

The first substrate 100 generally overlaps with the second substrate 200 and may protrude from the side surface of the second substrate 200 (as indicated by reference numeral 100p). As described herein, each of the first substrate 100 and the second substrate 200 includes a first side, a second side, a third side and a fourth side. The first side, the second side and the third side of the first substrate 100 may be aligned with the first side, the second side and the third side of the second substrate 200, respectively, while the fourth side of the first substrate 100 may protrude outward from the fourth side of the second substrate 200. Accordingly, a protrusion 110p adjacent to the fourth side of the first substrate 100 might not be covered by the second substrate 200 but may be exposed.

A driver may be disposed in the protrusion 110p adjacent to the fourth side of the first substrate 100. The driver may include a driver circuit 12 in the form of a chip as shown in the drawings. The driver circuit 12 may be disposed outside of the inner space defined by the sealant 400. Although the driver circuit 12 is mounted directly on the first surface 110 of the first substrate 100 in the drawings, the disclosure is not necessarily limited thereto. For example, one or more insulating films or conductive layers may be disposed on the first substrate 100 and the driver circuit 12 may be mounted thereon. Alternatively, the driver may include only driving lines without the driver circuit 12 in the form of a chip, and a driver circuit 12 may be mounted thereon or a separate film, printed circuit board or flexible printed circuit board connected thereto may be located at the end of the driver.

The sealant 400 may be disposed in the non-display area NDA inside the display device 10 to form a closed curve when viewed from the top and may surround the display area DA of the display panel. The sealant 400 may surround the light-emitting elements disposed in the display area DA, and may be disposed between the first substrate 100 and the second substrate 200 along the border of the second substrate 200 in a closed curve shape, to attach the first substrate 100 and the second substrate 200 together. The sealant 400 may include an epoxy adhesive, an ultraviolet curing adhesive, a frit, and/or the like. It should be noted that this is merely illustrative but is not necessarily limiting.

The sealant 400 defines the inner space of the display device 10 along with the first substrate 100 and the second substrate 200. According to this definition, the display 300 disposed on the first surface 110 of the first substrate 100 may also be interpreted as being disposed in the inner space. The inner surface 410 and/or the outer surface 420 of the sealant 400 may be disposed perpendicular to the first substrate 100 and the second substrate 200. Accordingly, the inner space defined by the sealant 400, the first substrate 100 and the second substrate 200 may have a cuboidal shape. The upper and lower surfaces of the cuboidal inner space may be the first substrate 100 and the second substrate 200, respectively, and the side surfaces may be the inner surfaces 410 of the sealant 400.

The outer surfaces 420 of the sealant 400 may be aligned with the first side, the second side, the third side and the fourth side of the second substrate 200, respectively. Accordingly, each of the side surfaces of the second substrate 200 and the respective outer surfaces 420 of the sealant 400 may be located on one plane.

The outer surfaces 420 of the sealant 400 may be aligned with the first side, the second side and the third side of the first substrate 100, but the side surface of the sealant 400 adjacent to the fourth side of the first substrate 100 might not be aligned with the fourth side. Accordingly, each of the side surfaces of the first substrate 100, i.e., each of the first to third sides of the first substrate 100 may be located on one plane together with the respective outer surfaces 420 of the sealant 400 and the side surfaces of the second substrate 200. The side surface of the first substrate 100, i.e., the fourth side of the first substrate 100 might not be located on the same plane with the plane formed by the side surface of the second substrate 200 but may be located on a different plane that is spaced apart from and is parallel to it.

Figure 3:
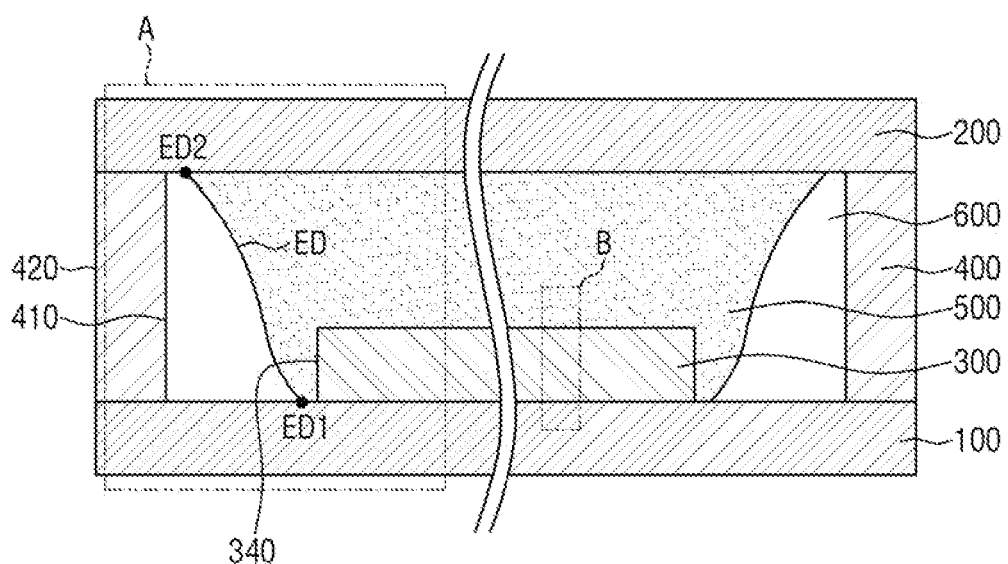
FIG. 3 is a cross-sectional view taken along line I-I' of FIG. 2.
Figure 4:
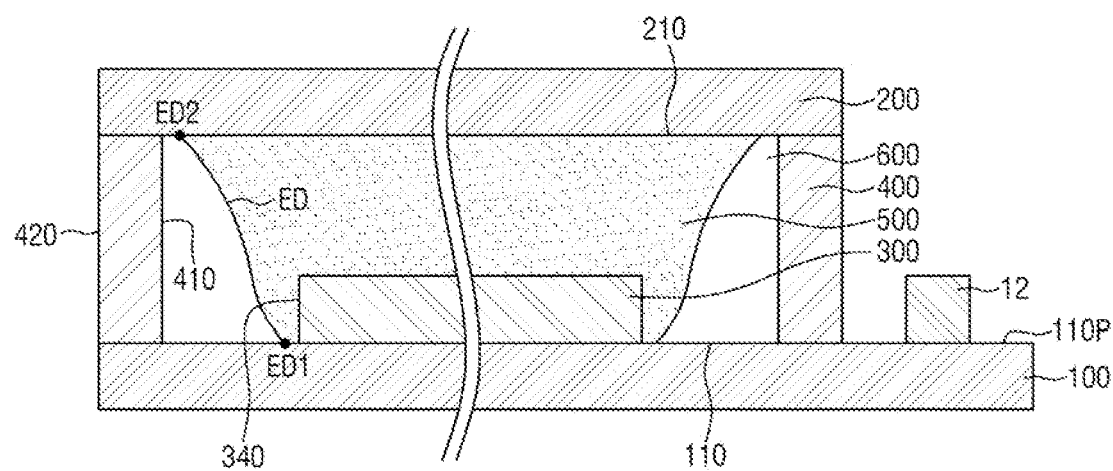
FIG. 4 is a cross-sectional view taken along line II-II' of FIG. 2.
Figure 5:
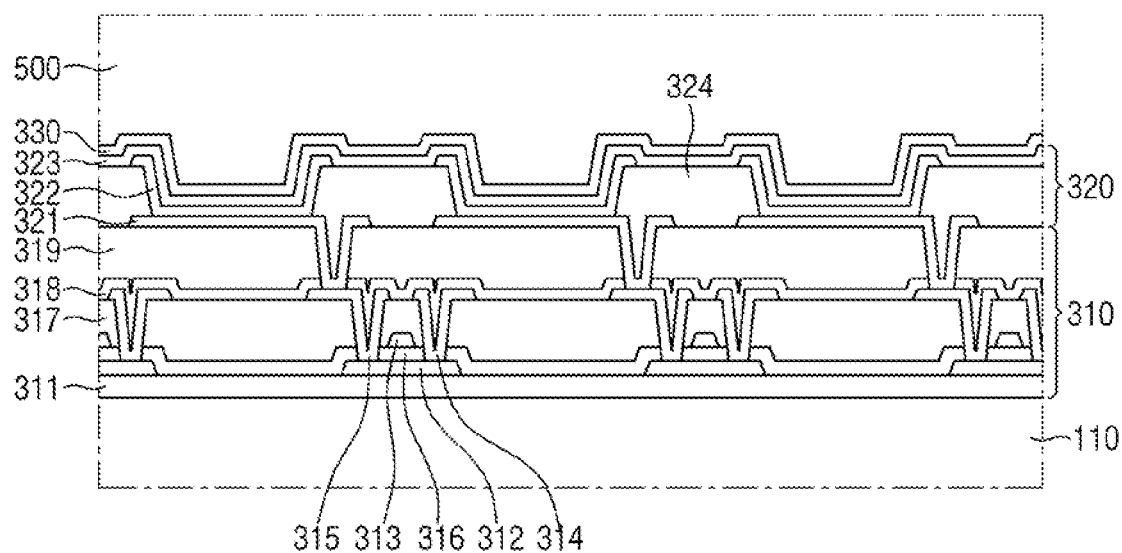
FIG. 5 is an enlarged view of portion B of FIG. 3.

FIG. 3 is a cross-sectional view taken along line I-I' of FIG. 2. FIG. 4 is a cross-sectional view taken along line II-II' in FIG. 2. FIG. 5 is an enlarged view of portion B of FIG. 3.

Referring to FIGS. 3 to 5, the display 300 is disposed on the first surface 110 of the first substrate 100. The display 300 may be formed on the first substrate 100 via a semiconductor process.

The first surface 210 of the second substrate 200 may be spaced apart from the first surface 110 of the first substrate 100 and/or the upper surface of the display 300. The space between the second substrate 200 and the first substrate 100 may be at least partially filled with a filler 500.

The display 300 is disposed on the first surface 110 of the first substrate 100 and displays an image. The display 300 may be one of: a top-emission display that provides image-related light toward the second substrate 200, a bottom-emission display that provides image-related light toward the rear side of the first substrate 100, and a dual-emission display that provides image-related light to both front and rear sides. In the following description, a top-emission display will be described as the display 300.

As shown in FIG. 5, the display 300 may include a thin-film transistor layer 310, a light-emitting element layer 320, and a capping film 330 sequentially disposed on the first substrate 100.

The thin-film transistor layer 310 may be disposed on the first substrate 100. The thin-film transistor layer 310 may include a conductive film, an insulating film, and a semiconductor layer 312 forming thin-film transistors, and an insulating film and/or a conductive film disposed above and below them.

A buffer film 311 may be disposed on the first substrate 100, and the semiconductor layer 312 may be disposed on the buffer film 311.

A gate insulator 316 may be disposed on the semiconductor layer 312, and a first conductive layer including a gate electrode 313 that at least partially overlaps the semiconductor layer 312 may be disposed on the gate insulator 316.

An interlayer dielectric film 317 may be disposed on the first conductive layer, and a second conductive layer including a data line, a source electrode 314 and a drain electrode 315 may be disposed on the interlayer dielectric film 317. The source electrode 314 and the drain electrode 315 are electrically connected to the semiconductor layer 312 through a contact hole penetrating the interlayer dielectric film 317 and the gate insulator 316. The semiconductor layer 312, the gate electrode 313, the source electrode 314 and the drain electrode 315 described above may form a thin-film transistor.

A passivation film 318 may be disposed on the second conductive layer, and a planarization film 319 may be disposed on the passivation film 318.

The light-emitting element layer 320 may be disposed on the thin-film transistor layer 310. The light-emitting element layer 320 may include light-emitting elements and a pixel-defining film 324.

For example, an anode electrode 321 may be disposed on the planarization film 319. The anode electrode 321 may be a pixel electrode. The anode electrode 321 may be connected to the source electrode 314 or the drain electrode 315 of the thin-film transistor layer 310 through a contact hole penetrating the planarization film 319 and the passivation film 318.

The pixel-defining film 324 is disposed on the anode electrode 321. The pixel-defining film 324 includes an opening via which at least a part of the anode electrode 321 is exposed. The pixel-defining film 324 may include an organic material or an inorganic material.

An emissive layer 322 may be disposed on the anode electrode 321 exposed by the pixel-defining film 324. According to an embodiment of the disclosure, the emissive layer 322 may include an organic, emissive layer and may further include hole injection/transport layers and/or electron injection/transport layers as auxiliary layers to facilitate emission. It should be understood, however, that the disclosure is not necessarily limited thereto. An inorganic emissive layer including an inorganic semiconductor may be included as the emissive layer 322.

A cathode electrode 323 may be sequentially disposed on the emissive layer 322. The cathode electrode 323 may be a common electrode.

The above-described anode electrode 321, the emissive layer 322 and the cathode electrode 323 may form a light-emitting diode.

The capping film 330 may be disposed on the cathode electrode 323. The capping film 330 may have a shape conformal to the underlying structure. The cathode electrode 323 disposed under the capping film 330 may include the surface profile along the underlying structure, and such a surface profile of the cathode electrode 323 may be reflected in the upper surface profile of the capping film 330. For example, the upper surface of the capping film 330 may include a depression overlapping the emissive layer 322 and an elevation overlapping the pixel-defining film 324.

The filler 500 may be disposed on the capping film 330, which is the top layer of the display 300, and the second substrate 200 may be disposed on the filler 500. The filler 500 is used to fill the space between the first substrate 100 on which the display 300 is disposed and the second substrate 200.

The filler 500 may cover the upper surface of the capping film 330. In addition, the bottom surface of the filler 500 may be in direct contact with the upper surface of the capping film 330. The entire upper surface of the capping film 330 may be in contact with the bottom surface of the filler 500 so that no empty space 600 is formed between the bottom surface of the filler 500 and the upper surface of the capping film 330. The bottom surface of the filler 500 may have a shape complementary to the profile of the upper surface of the capping film 330.

The upper surface of the filler 500 may be in contact with the first surface 210 of the second substrate 200, and may have a flat shape like the shape of the first surface 210 of the second substrate 200. Accordingly, the filler 500 may have different thicknesses where it overlaps with the display 300. For example, the part of the filler 500 overlapping the emissive layer 322 may be thick while the part of the filler 500 overlapping the pixel-defining film 324 may be thin.

According to this embodiment, the bottom surface of the filler 500 is in direct contact with the upper surface of the capping film 330, and the upper surface of the filler 500 is in direct contact with the first surface 210 of the second substrate 200. It should be understood, however, that the disclosure is not necessarily limited thereto. For example, an inorganic film or another functional layer may be additionally stacked on the capping film 330, and in such case, the bottom surface of the filler 500 may be in direct contact with the additionally stacked layer at the top. In addition, one or more layers may be stacked on the first surface 210 of the second substrate 200. In such case, the upper surface of the filler 500 may be in direct contact with the top layer that is additionally stacked (the layer located at the bottom in the drawing).

The filler 500 may be made of a material that can transmit light and can mitigate (e.g., absorb and dissipate) a shock. In addition, the filler 500 can prevent the fluctuation of the display 300 and can prevent oxygen or moisture from permeating into the emissive layer 322, the cathode electrode 323 and the capping film 330.

In an embodiment, the filler 500 may be made of an organic material. For example, the filler 500 may be made of, but is not necessarily limited to, a silicon-based organic material, an epoxy-based organic material, an acrylic-based organic material, etc.

In some embodiments, the filler 500 may be made of a high-viscosity material having a viscosity of 10,000 cP or higher. In such case, the cohesive force in the filler 500 may be strong, but the disclosure is not necessarily limited thereto. For example, a low-viscosity material having the viscosity of 30 cP may be used as the filler 500 of the display device 10.

The filler 500 may, as a mass, cover all the surfaces of the display 300 except for the surface in contact with the first substrate 100. For example, when the side surfaces 340 of the display 300 are spaced apart from the sealant 400 as shown in FIG. 3, the filler 500 may cover the side surfaces as well as the upper surface of the display 300. The first substrate 100 is not covered by the display 300 but is exposed where the sealant 400 is spaced apart from the side surfaces of the display 300. The filler 500 may also be in contact with the first surface 110 of the first substrate 100 exposed on the outer side of the display 300.

In addition, the area in which the filler 500 is in contact with the first surface 210 of the second substrate 200 may be larger than the area in which the filler 500 is in contact with the first surface 110 of the first substrate 100.

As described above, the filler 500 has such a shape that is extended from the display 300 to the periphery of the display 300. It should be noted that the filler 500 may be extended to the extent that it is not in contact with the sealant 400. Therefore, the filler 500, according to the embodiment, is not in contact with the sealant 400. As a result, it is possible to prevent defects of delamination of the sealant 400, which may occur if the filler 500 and the sealant 400 are in direct contact with each other and thus the sealant 400 is contaminated by the filler 500.

The empty space 600 between the side surface of the filler 500 and the inner surface of the sealant 400 spaced apart from each other, is occupied by neither liquid nor solid material, and may be in a vacuum state, may be filled with a particular gas or gases, or may be an air gap. The empty space 600 may be located at the edge of the inner space surrounded by the first substrate 100, the second substrate 200 and the sealant 400, and the filler 500 may be disposed therein.

A part of the side surface of the filler 500 in contact with the empty space 600 is defined as an edge ED of the filler 500. In addition, a portion where the filler 500, the first substrate 100 and the empty space 600 are in contact with one another is referred to as a first edge ED1, while a portion where the filler 500, the second substrate 200 and the empty space 600 are in contact with one another is referred to as a second edge ED2.

As shown in FIG. 3, the edge ED of the filler 500 may have an inclined shape with respect to the first surface 210 of the second substrate 200. For example, the edge ED of the filler 500 is spaced apart from the sealant 400, and the distance from the sealant 400 to the first edge ED1 is greater than the distance from the sealant 400 to the second edge ED2. Accordingly, the edge ED of the filler 500 extended from the first edge ED1 to the second edge ED2 might not be parallel to the inner surface 410 of the sealant 400 but may be inclined with respect to it. In FIG. 3, the edge ED of the filler 500 adjacent to the sealant 400 may have the same shape on the left and right hands and accordingly, the display device 10 may be vertically symmetrical in the cross-sectional view. Since the edge ED of the filler 500 has a slope, it is possible to apply the filler 500 in the wide first surface 210 of the second substrate 200 even with a small amount of the filler 500, so that the material can be saved.

Referring to FIG. 4 in conjunction with FIG. 3, the area surrounded by the first substrate 100, the second substrate 200 and the sealant 400 may be the same in the horizontal cross-sectional view (FIG. 3) as well as in the longitudinal cross-sectional view (FIG. 4). For example, the edges ED of the filler 500 may be formed in the same shape in all directions. It should be understood, however, that the embodiments of the disclosure are not necessarily limited thereto. As an example, the angle between the first substrate 100 and the edge ED of the filler 500 on the side where the driver circuit 12 of the driver is disposed may be different from the angle between the first substrate 100 and the other edges ED of the filler 500 because signal lines connected to the display 300 from the driver are disposed under the filler 500.

Figure 6:
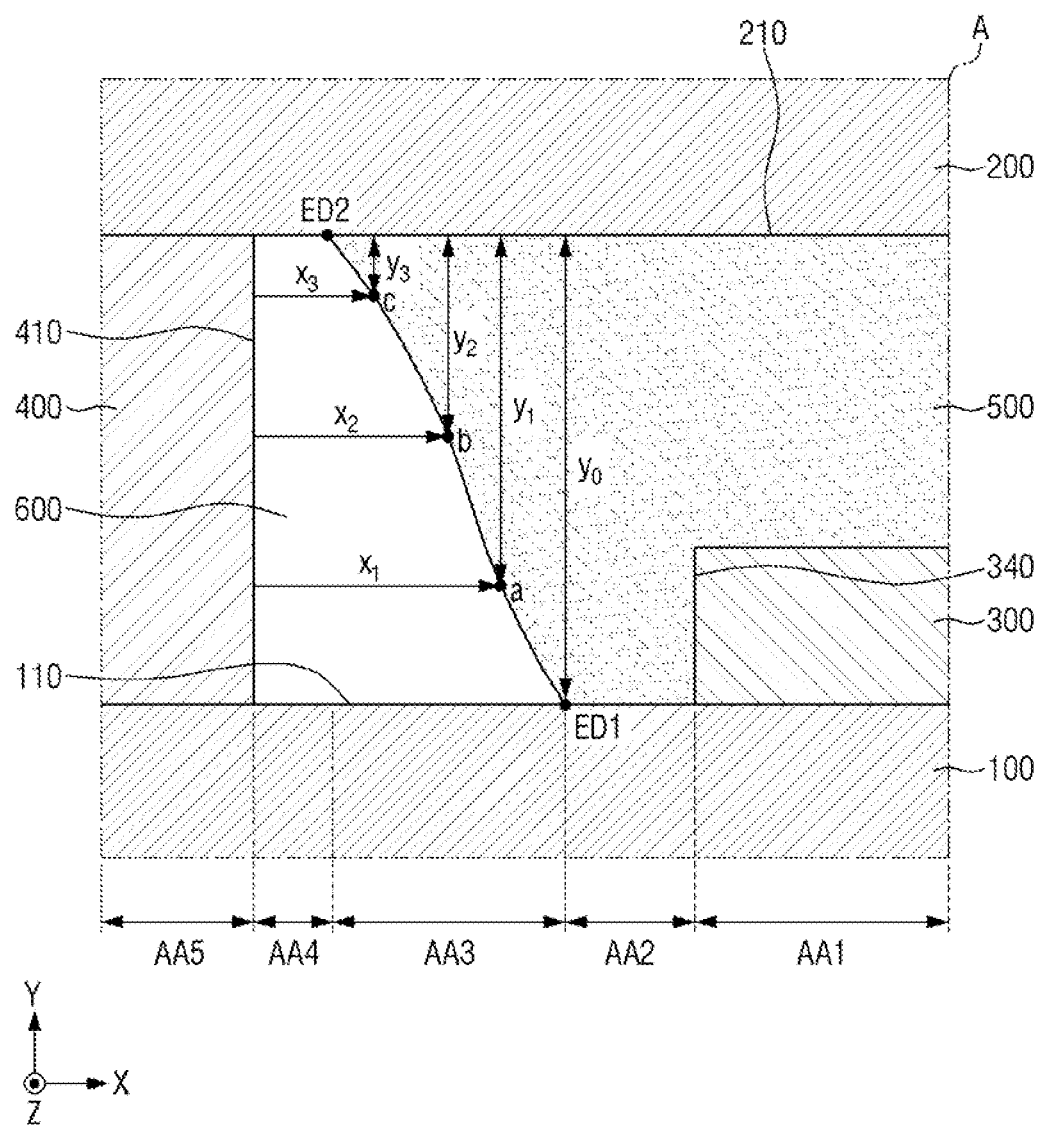
FIG. 6 is an enlarged view of portion A of FIG. 3.
Figure 7:
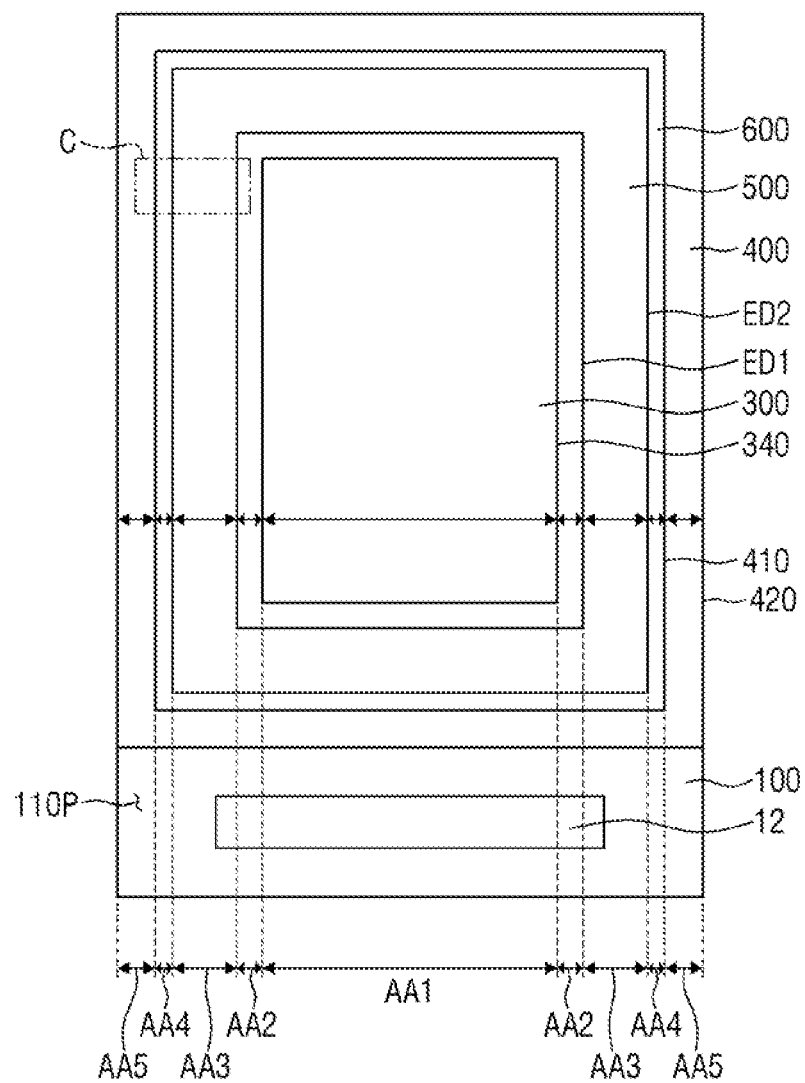
FIG. 7 is a plan view showing a layout of the display device viewed from the second surface of the second substrate.

FIG. 6 is an enlarged view of portion A of FIG. 3. FIG. 7 is a plan view showing a layout of the display device viewed from the second surface of the second substrate.

Referring to FIG. 6, the display panel may be divided into a first area AA1 to a fifth area AA5 depending on the arrangement of the first substrate 100, the second substrate 200, the display 300, the sealant 400, the filler 500, and the empty space 600.

The first area AA1 may be the central portion of the display panel, in which the first substrate 100, the display 300, the filler 500 and the second substrate 200 may overlap one another. Referring to FIG. 6, in the first area AA1, the display panel may have the structure in which the first substrate 100, the display 300, the filler 500 and the second substrate 200 are located in this order from the lower side to the upper side of the cross-sectional view, and there might be no empty space 600. Although the filler 500 is thicker than the display 300 between the display 300 and the second substrate 200 in the drawings, the disclosure is not necessarily limited thereto. For example, the thickness of the filler 500 may be smaller than the thickness of the display 300, the first substrate 100, and the second substrate 200 in the first area AA1.

In the second area AA2, the first substrate 100 and the filler 500 are in direct contact with each other on the side surface 340 of the display 300. In the second area AA2, the display panel may have the structure in which the first substrate 100, the filler 500 and the second substrate 200 may be located in this order such that they overlap with one another. According to an embodiment of the disclosure, only the filler 500 is disposed in the space between the first substrate 100 and the second substrate 200 in the second area AA2, and thus the filler 500 has the largest thickness the second area AA2. In the second area AA2, the thickness of the filler 500 may be equal to the distance between the first surface 110 of the first substrate 100 and the first surface 210 of the second substrate 200.

In the third area AA3, the filler 500 is in contact with the second substrate 200 but not with the first substrate 100. In the third area AA3, the display panel may have the structure in which the first substrate 100, the empty space 600 and the filler 500 may be located in this order. The thickness of the filler 500 decreases toward the sealant 400, wherein the thickness of the filler 500 is defined as the distance from the first surface 210 of the second substrate 200 to the point between the filler 500 and the empty space 600 in the direction perpendicular to the second substrate 200. The thickness of the filler 500 at the boundary between the third area AA3 and the second area AA2 is denoted by y0. The thickness y0 may be equal to the distance between the first substrate 100 and the second substrate 200.

In the cross-sectional view of FIG. 6, the thickness of the filler 500 is measured at three different points a, b and c. The thickness at the point a that is closest to the second area AA2 is denoted by y1, the thickness at the point b that is in the middle is denoted by y2, and the thickness at the point c that is closest to the fourth area AA4 is denoted by y3. The thickness y1 may be greater than the thickness y2, and the thickness y2 may be greater than the thickness y3.

In the third area AA3, the filler 500 is in contact with the second substrate 200 and with the empty space 600. The surface of the filler 500 in contact with the second substrate 200 may be a flat surface, while the surface of the filler 500 in contact with the empty space 600 may be a curved surface. The width of the empty space 600 increases in the direction perpendicular to the inner surface 410 of the sealant 400 from the second substrate 200 to the first substrate 100, wherein the width of the empty space 600 is defined as the distance from the point at which the empty space 600 is in contact with the inner surface 410 of the sealant 400 to the surface at which the empty space 600 meets the filler 500. Three different points a, b and c are depicted on the boundary between the filler 500 and the empty space in FIG. 6. The width of the empty space 600 at the point a that is closer to the first substrate 100 is denoted by x1, the width of the empty space 600 at the point b that is in the middle is denoted by x2, and the width of the empty space 600 at the point c that is closer to the second substrate 200 is denoted by x3. The width x1 may be greater than the width x2, and the width x2 may be greater than the width x3.

In the fourth area AA4, no filler 500 is disposed between the first substrate 100 and the second substrate 200. In the fourth area AA4, the display panel may have the structure in which the first substrate 100, the empty space 600 and the second substrate 200 are located in this order.

In the fifth area AA5, the sealant 400 is disposed, and the first substrate 100, the sealant 400 and the second substrate 200 are disposed in this order. The sealant 400 may be disposed along the edges of the first substrate 100 and the second substrate 200 to surround the display area DA when viewed from the top. The first substrate 100 and the second substrate 200 may be coupled with each other by the sealant 400. The space between the first substrate 100 and the second substrate 200 may be completely filled with the sealant 400. The surface of the sealant 400, which is the surface where the sealant 400 and the first substrate 100 are in contact with each other, may have the same shape as the opposite surface of the sealant 400, which is the surface where the sealant 400 and the second substrate 200 are in contact with each other. The surface and the opposite surface of the sealant 400 may be parallel to each other.

As described above, the edge ED of the filler 500 may have a shape extended from the upper left end in contact with the second substrate 200 to the lower right end in contact with the first substrate 100. As described herein, the intersection of the first surface 210 of the second substrate 200 and the inner surface 410 of the sealant 400 is the origin, the first surface 210 of the second substrate 200 is the x-axis, and the inner surface of the sealant 400 is the y-axis. Then, the graph formed by the edge ED of the filler 500 may generally have a negative slope. It should be understood, however, that the disclosure is not necessarily limited thereto. For example, when the filler 500 having high viscosity is applied, the slope of the graph may have a positive value near the second edge ED2.

Figure 8:
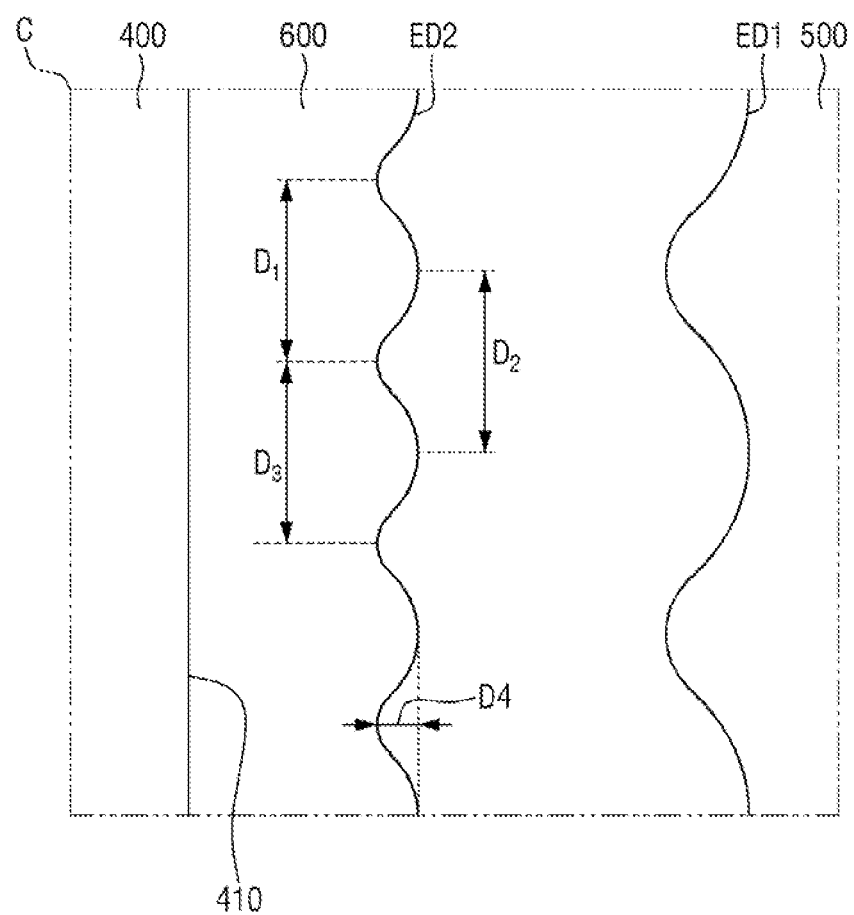
FIG. 8 is an enlarged view of portion C of FIG. 7.

Referring to FIGS. 6 and 7, when the display device 10 is viewed from the second surface of the second substrate 200, the sealant 400, the first edge ED1, the second edge ED2 and the display 300 may be different closed curve shapes sharing the center. For example, the second edge ED2 may be disposed more to the inside than the sealant 400, and the first edge ED1 may be disposed more to the inside than the second edge ED2. Each of the closed curves is symmetrical vertically and horizontally. The vertexes on one side of the rectangle may be located on a straight line. In addition, as shown in FIG. 7, the shape of the first edge ED1 and the shape of the second edge ED2 are similar to each other when viewed from the top and may have a uniform width. For example, the first edge ED1 and the second edge ED2 may have a uniform distance along the border of the filler 500 and may be disposed on the inner side of the inner surface 410 of the sealant 400. Although the sides of the rectangle are shown as straight lines in the drawings, each of the sides of the closed curve formed by the first edge ED1 and the second edge ED2 may have a wave shape as shown in FIG. 8 to be described later when enlarged.

The shape of the filler 500 on the surface where the second substrate 200 and the filler 500 are in contact and the surface where the first substrate 100 and the filler 500 are in contact, i.e., the shape of the first edge ED1 and the shape of the edge ED2 viewed from the second surface of the second substrate 200 may be a rectangular shape, but the disclosure is not necessarily limited thereto. The shape may have a circular shape or a quadrilateral shape with rounded corners.

The shape of the second edge ED2 may be altered in a variety of ways depending on a method of applying the filler 500. For example, when the filler 500 is applied along the inner surface 410 of the sealant 400 such that they are spaced apart from each other by a constant distance, the shape of the inner surface 410 of the sealant 400 may be similar to the shape of the second edge ED2.

The shape of the first edge ED1 may be determined depending on a variety of shapes formed as the filler 500 spreads during the process of bringing the filler 500 applied on the second substrate 200 into contact with the first substrate 100 and the display 300 disposed on the first surface 110 of the first substrate 100.

FIG. 8 is an enlarged view of portion C of FIG. 7.

As shown in FIG. 8, the inner surface 410 of the sealant 400 may have a straight line shape, while the first edge ED1 and the second edge ED2 of the filler 500 adjacent thereto may have a wave shape formed by connecting water droplets.

Referring to FIG. 8, the filler 500 may have a shape in which convex portions and concave portions are alternately arranged when viewed from the sealant material 400. Accordingly, each of the first edge ED1 and the second edge ED2 of the filler 500 includes a curved extension, and the offset value of each curved extension may be larger than the offset value of the inner surface 410 of the sealant 400 having a generally linear shape. In addition, in the space defined by the inner surfaces 410 of the sealant 400, the size (or diameter) of the droplets of the filler 500 applied to the center may be greater than the size (or diameter) of the droplets of the filler 500 applied to the outer portion. The wave shape formed by the first edge ED1 may have a larger wavelength and/or amplitude than the wave shape formed by the second edge art ED2 has. It should be understood, however, that the disclosure is not necessarily limited thereto.

Each convex portion of the second edge ED2 may have a most protruding vertex toward the sealant 400 between the concave portions adjacent thereto. In addition, each concave portion may have a most protruding vertex away from the sealant 400 between the convex portions adjacent thereto. In any three adjacent convex vertices, the deviations in the distance from the convex vertex at the center to the both convex vertices may be within 10%. In any three adjacent concave vertices, the deviations in the distance from the concave vertex at the center to the both concave vertices may be within 10%. Incidentally, deviations between the distance between any two adjacent convex vertices and the distance from a concave vertex positioned between the two convex vertices to the adjacent concave vertex may be within 10%. In addition, as shown in FIG. 8, the shortest distance D4 from the straight line connecting adjacent concave vertices to a convex vertex therebetween may be 10 µm or less. It is, however, to be understood that the disclosure is not necessarily limited thereto. The first edge ED1 and the second edge ED2 may have an offset value substantially equal to that of the inner surface 410 of the sealant 400, or the inner surface 410 of the sealant 400, the corners of the first edge ED1 and the second edge ED2 all may be straight lines.

For an example, the offset value of the inner surface 410 of the sealant 400 may be greater than the offset value of the first edge ED1 and the offset value of the second edge art ED2. For an example, only the corner of the first edge ED1 may have an offset value, while the corners of the inner surface 410 of the sealant 400 and the second edge ED2 may be straight lines.

Hereinafter, an example of a method of fabricating the display device 10 described above will be described.

Figure 9:
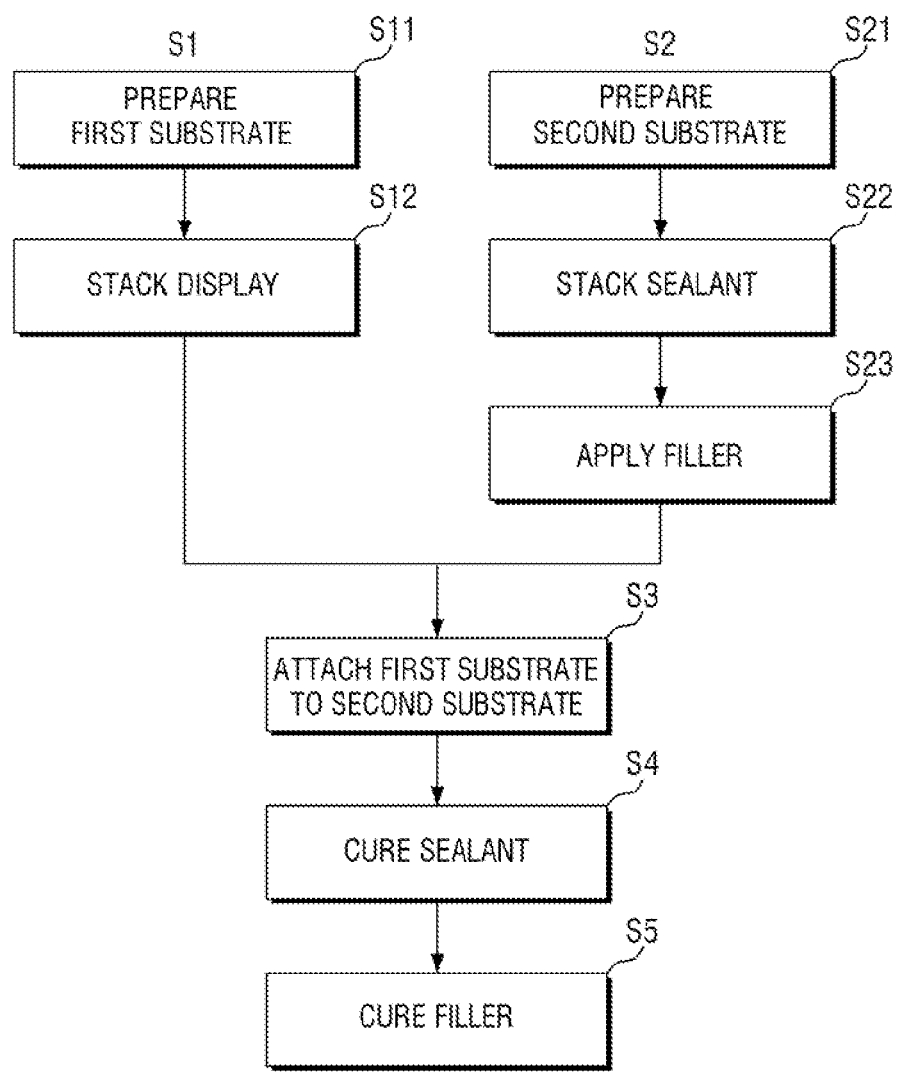
FIG. 9 is a flowchart illustrating a method of fabricating a display device according to an embodiment of the disclosure.

FIG. 9 is a flowchart for illustrating a method of fabricating a display device according to an embodiment of the disclosure.

Referring to FIG. 9, the method of fabricating the display device 10 according to the embodiment may include: preparing a first substrate 100 on which a display 300 is stacked (step S1); preparing a second substrate 200 on which a sealant 400 and a filler 500 are stacked (step S2); attaching the first substrate 100 to the second substrate 200 (step S3); curing the sealant 400 (step S4); and curing the filler 500 (step S5).

One of the step S1 of preparing the first substrate 100 on which the display 300 is stacked and the step S2 of preparing the second substrate 200 on which the sealant 400 and the filler 500 are stacked may be carried out prior to the other or they may be carried out simultaneously.

The preparing of the first substrate 100 on which the display 300 is stacked S1 may include preparing the first substrate 100 (step S11) and stacking the display 300 on the first substrate 100 (step S12).

The preparing of the second substrate 200 on which the sealant 400 and the filler 500 are stacked S2 may include preparing the second substrate 200 (step S21), stacking the sealant 400 on the second substrate 200 (step S22), and applying the filler 500 to the inner space of the sealant 400 (step S23).

Although the step S5 of curing the filler 500 is carried out after the step S4 of curing the sealant 400 in the flowchart, the disclosure is not necessarily limited thereto. For example, after the curing the filler 500 S5, the curing the sealant 400 S4 may be carried out.

Hereinafter, a method of fabricating the display device 10 will be described in detail with reference to processing steps shown in FIGS. 10 to 20 in conjunction with the flowchart of FIG. 9.

FIGS. 10 to 20 are plan views and cross-sectional views showing processing steps of a method of fabricating a display device according to an embodiment.

Figure 10:
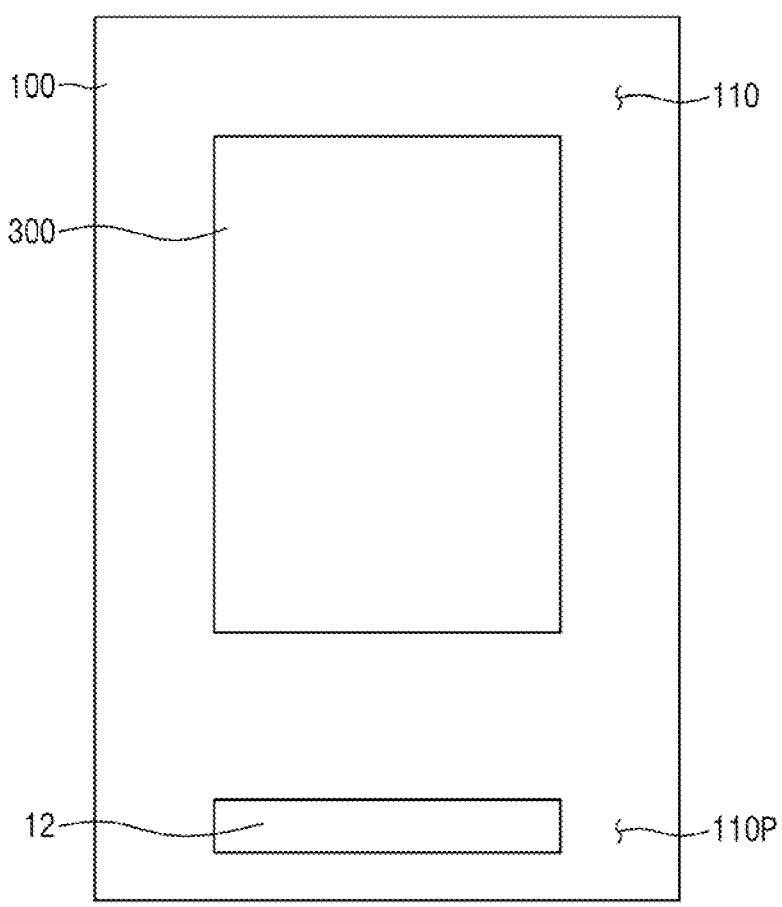
FIGS. 10 to 15 are plan views showing processing steps of a method of fabricating a display device according to an embodiment.

Referring to FIGS. 9 and 10, initially, a first substrate 100 is prepared, and a display 300 is stacked on a first surface 110 of the first substrate 100 (step S1). The display 300 is identical to one described above with reference to FIGS. 3 and 7, and any of a variety of displays that are well known in the art may be employed.

Figure 11:
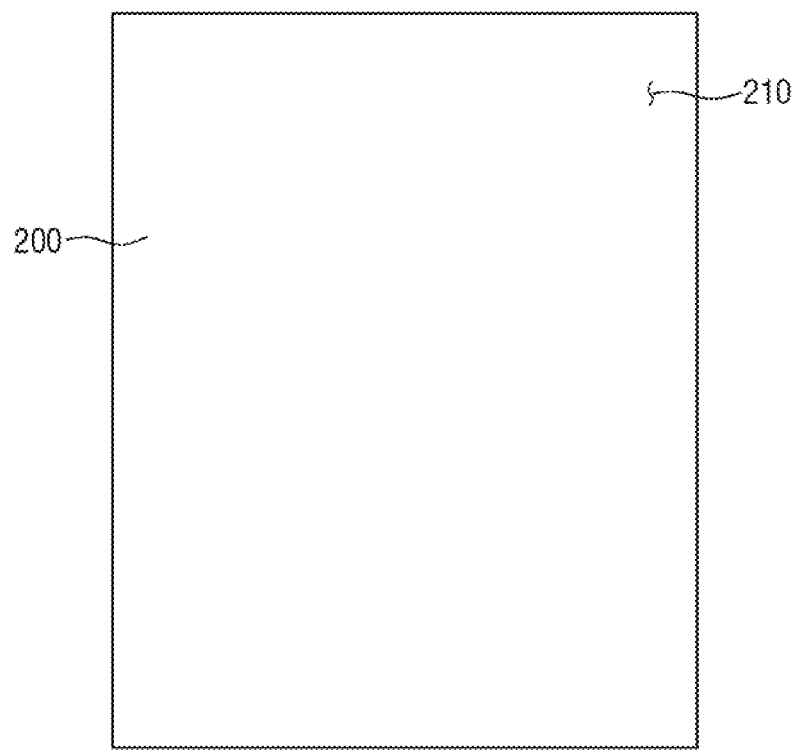
Figure 12:
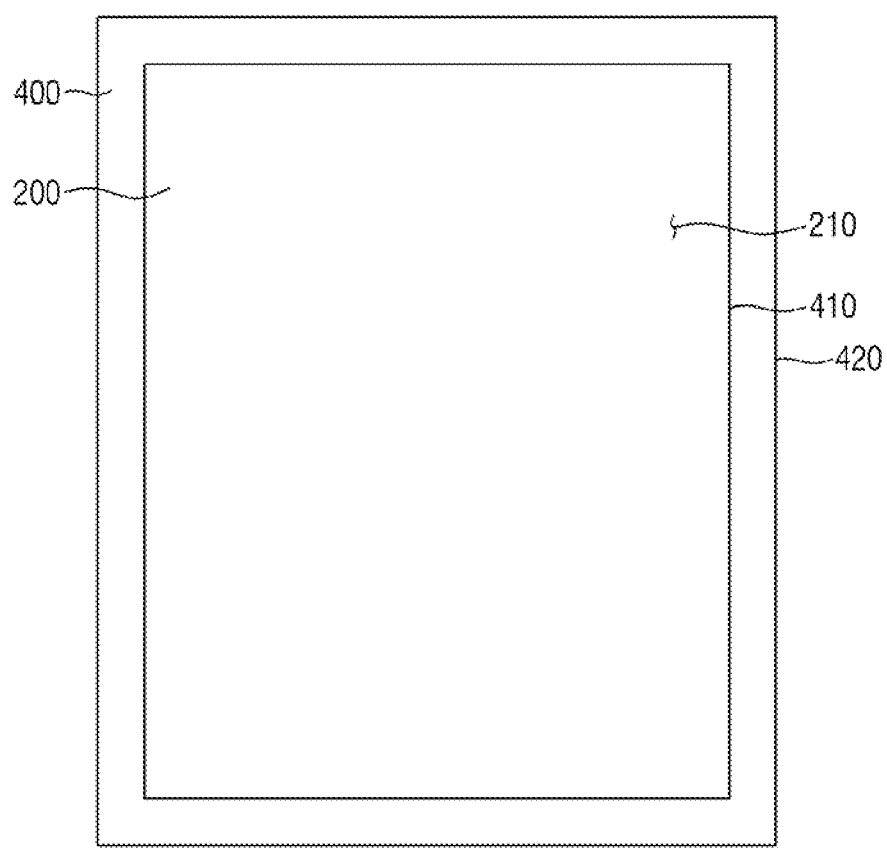
Figure 13:
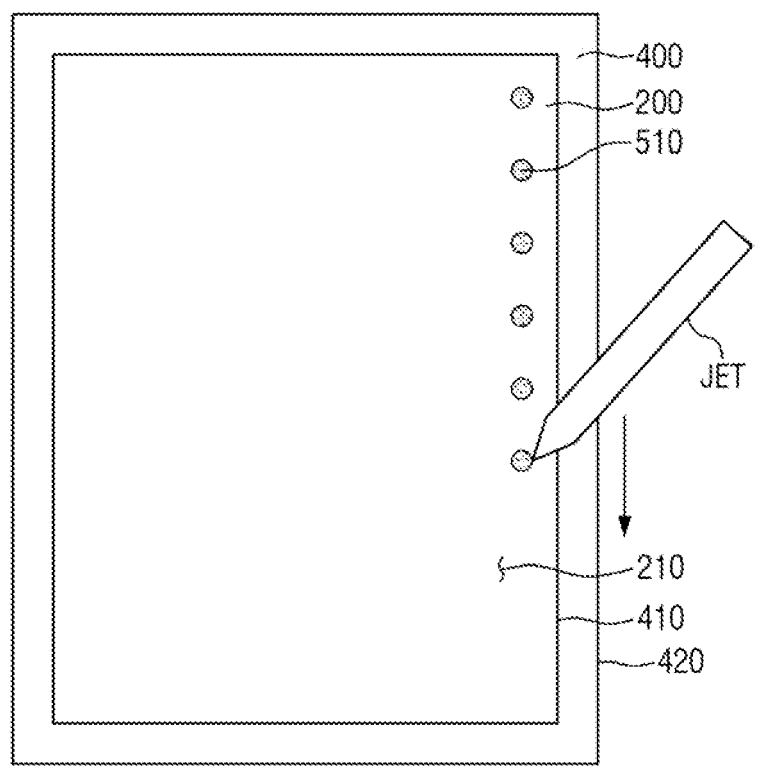
Figure 14:
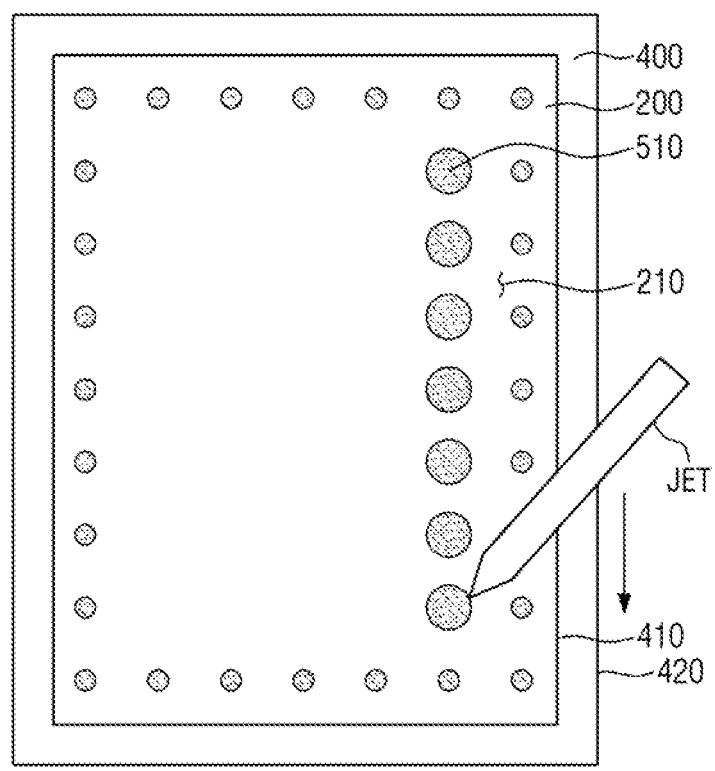
Figure 15:
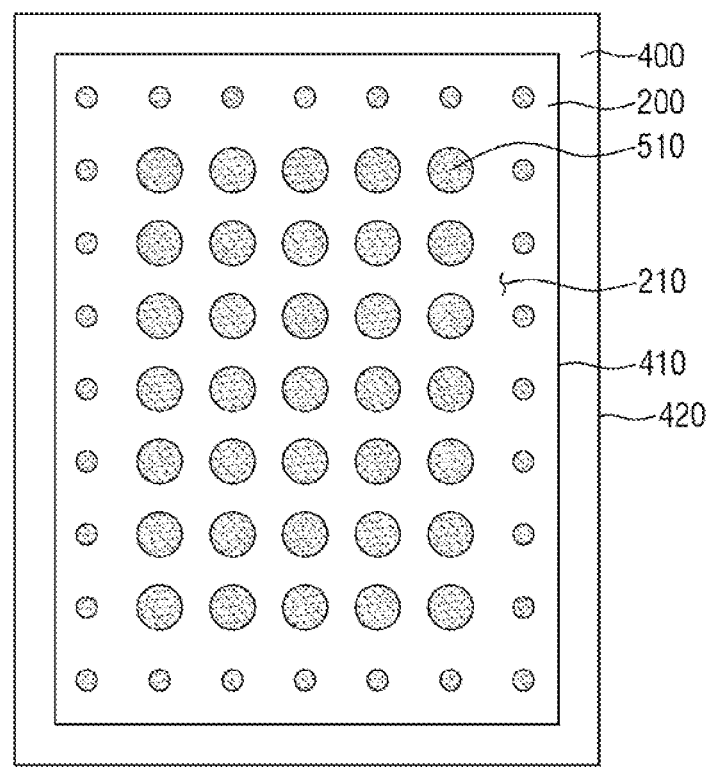

Subsequently, referring to FIGS. 9, 11 and 12, a second substrate 200 is prepared, and a sealant 400 is applied on a first surface 210 of the second substrate 200 along the edge of the first surface 210 of the second substrate 200 and is stacked on it (steps S21 and S22). Although the sealant 400 is formed on the first surface 210 of the second substrate 200 in the drawings, the disclosure is not necessarily limited thereto. The sealant 400 may be formed on the first surface 110 of the first substrate 100. Reference numerals 410 and 420, which are not described above, are used to denote the inner surface 410 and the outer surface of the sealant 400, respectively.

Subsequently, referring to FIGS. 9 and 13 to 15, an uncured filler 510 is applied on the inner side of the sealant 400 (step S23). For example, the uncured filler 510 may be applied on the inner space defined by the inner surface 410 of the sealant 400 on the first surface 210 of the second substrate 200 using a jet dispenser JET.

Initially, the uncured filler 510 is applied at regular spacing with a first density along the outer portion of the first surface 210 of the second substrate 200 adjacent to the inner surface 410 of the sealant 400 (first application). The distance between the droplets of the uncured filler 510 may be constant, and the points at which the droplets are applied may be spaced apart from one another. The applied droplets of the uncured filler 510 may be spaced apart from the inner surface 410 of the sealant 400 and the other droplets of the cured filler 510 by the constant distance. Accordingly, the droplets of the filler 510 that are not cured after the first application may generally form a dotted rectangular shape arranged along the inner surface 410 of the sealant 400. Although the uncured filler 510 is applied in a single row in the first application in the drawings, the disclosure is not necessarily limited thereto. For example, the uncured filler 510 may be applied in two, three or more rows spaced apart from one another in the first application. When the uncured filler 510 is applied in three or more rows, the points may be arranged more densely compared to the uncured filler 510 applied in a single row.

After the first application of the uncured filler 510, an uncured filler 510 is applied at points on the first surface 210 of the second substrate 200 which are more to the inside than the points of the first application (second application). In the second application, the amount of the uncured filler 510 to be applied may be increased compared to that in the first application. Accordingly, the size (or diameter) of each of the droplets of the uncured filler 510 applied in the second application may be larger than the size (or diameter) of each of the droplets of the uncured filler 510 applied in the first application. For example, the second density of the second application may be greater than the first density of the first application.

The spacing between the centers of the droplets of the uncured filler 510 in the second application may be equal to the spacing between the centers of the droplets of the uncured filler 510 in the first application and may be equal to the spacing between the centers of the droplets of the uncured filler 510 in the second application and the centers of the droplets of the filler 510 in the first application. It should be understood, however, that the disclosure is not necessarily limited thereto. Unlike the first application in which the uncured filler 510 is applied in a single row along the inner surface of the sealant 400, the uncured filler 510 may be applied throughout the entire first surface 210 of the second substrate 200 in the second application.

Figure 16:
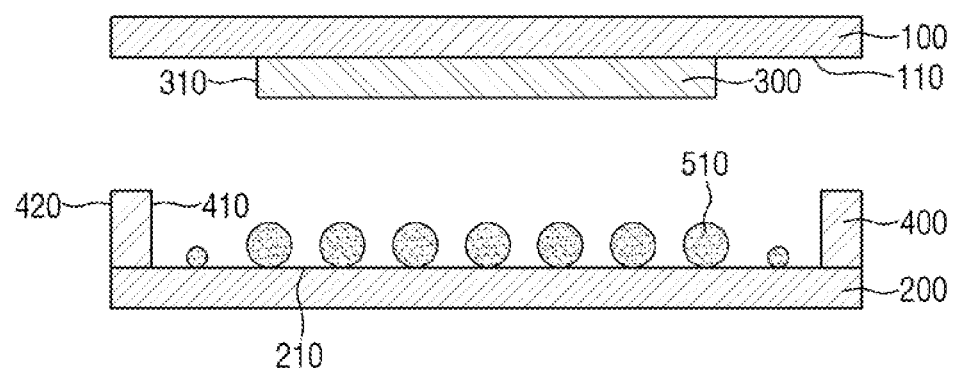
FIGS. 16 to 19 are cross-sectional views showing processing steps of a method of fabricating a display device according to an embodiment.

The shape of each of the applied droplets of the uncured filler 510 may be hemispherical, but might not be perfectly hemispherical. For example, the face of each of the droplets in contact with the first surface 210 of the second substrate 200 may be a flat circular shape conforming to the first surface 210 of the second substrate 200. The face of each of the droplets not in contact with the first surface 210 of the second substrate 200 may be a curved surface having a cross-section which is not a semicircle. In the drawings, the uncured filler 510 is separately applied in the first and second applications and is applied at the points which are regularly spaced apart from one another. It should be understood, however, that the disclosure is not necessarily limited thereto. For example, with two nozzles having different discharge capacities, or with a single nozzle by adjusting the application time and/or application rate at each point, it is possible to apply the droplets of the filler 500 as shown in FIG. 16. In addition, different amounts of the uncured filler 510 may be applied to different areas by varying the spacing between the application points. The reference numeral 420, which is not described above, is used to denote the outer surface 420 of the sealant 400.

Figure 17:
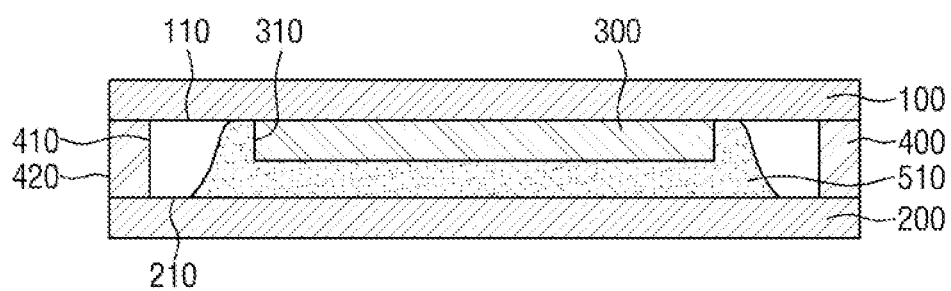

Referring to FIGS. 9, 16 and 17, the first substrate 100 may be placed above the second substrate 200 so that the first surface 110 of the first substrate 100 faces the first surface 210 of the second substrate 200. By moving the first substrate 100 toward the second substrate 200, the first substrate 100 and the second substrate 200 may be attached together by the sealant 400. In doing so, the uncured filler 510 is brought into tight contact with the first substrate 100 and/or the display 300 formed on the first substrate 100 and thus is subjected to pressure. Accordingly, the droplets of the uncured filler 510 may spread and come in contact with one another so that they may be combined into one large uncured filler 510 as a mass (step S3).

For example, as the first substrate 100 and the second substrate 200 are attached together, some of the droplets of the uncured filler 510 applied on the first surface 210 of the second substrate 200 may overlap and may be in contact with the display 300. Accordingly, the upper portion of each of the droplets of the uncured filler 510 in contact with the display is subjected to pressure. In doing so, the droplets of the uncured filler 510 are liquid, and thus they may spread in the lateral direction rather than the vertical direction the pressure is received. Adjacent droplets of the uncured filler 510 may also undergo the same process. Accordingly, different droplets of the uncured filler 510 may come into contact with one another. This process may occur simultaneously in all the droplets of the uncured filler 510 overlapping the display 300 and may be combined with other droplets of the filler 500 in series to agglomerate together.

As described above, since a smaller amount of the filler 500 is applied at the outer portion of the first surface 210 of the second substrate 200 in the first application, it is possible to avoid that the filler 500 spreads in the lateral direction when the droplets of the filler 500 agglomerate together. For example, since a small amount of filler 500 is disposed at the outer portion of the first surface 210 of the second substrate 200, they do not receive much pressure in the vertical direction even though the droplets agglomerate together. As a result, they are restricted from spreading in the lateral direction (i.e., toward the inner surface 410 of the sealant 400). For example, even when a low-viscosity material of 30 cP as well as a high-viscosity material of 10,000 cP is used as the filler 500, it is possible to restrict the filler 500 from spreading in the lateral direction by adjusting the amount of the material at the outer portion in the first application. Accordingly, the space can be ensured between the filler 500 and the sealant 400, and thus it is possible to prevent contact between them.

In addition, although the droplets of the filler 500 applied at the outer portion of the first surface 210 of the second substrate 200 in the first application may be in contact with the filler 500 adjacent to them toward the central portion of the first surface 210 of the second substrate 200. There is no droplet of the filler 500 toward the inner surface 410 of the sealant 400, and thus the droplets of the filler 500 applied at the outer portion in the first application may still be in contact with the empty space 600. The filler 500 forming a large mass receives a force in a direction to reduce the surface area according to the surface tension, and thus the droplets of the filler 500 disposed at the outermost position on the first surface 210 of the second substrate 200 applied in the first application do not move toward the inner surface 410 of the sealant 400. In this manner, the mass of the filler 500 still can be spaced apart from the inner surface 410 of the sealant 400 even though the filler 500 forms the mass as the first substrate 100 and the second substrate 200 are attached together.

Incidentally, the outer portion of the first substrate 100 where the display 300 is not disposed has a larger space between the first surface 210 of the second substrate 200 and the first surface 110 of the first substrate 100 than the central portion where the display 300 is disposed. A smaller amount of the filler 500 is applied at the outer portion and thus the space between the first surface 210 of the second substrate 200 and the first surface 110 of the first substrate 100 cannot be filled with filler 500 at the outer portion. In addition, the filler 500 is applied on the first surface 210 of the second substrate 200. Therefore, the filler 500 is in contact with the first surface 210 of the second substrate 200 while it is spaced apart from the first surface 110 of the first substrate 100 at the outer portion. As a result, the edge ED of the filler 500 may slope downward toward the first surface 110 of the first substrate 100 from the first surface 210 of the second substrate 200. For example, when the first substrate 100 is located above the second substrate 200, the edge ED of the filler 500 may have a reverse tapered shape.

The material disposed at the outer portion of the first surface 210 of the second substrate 200 and forming the inclined region of the filler 500 may be the same as the material disposed at the central portion and forming the thicker region. It should be understood, however, that the disclosure is not necessarily limited thereto. For example, the filler 500 disposed at the outer portion of the first surface 210 of the second substrate 200 and the filler 500 disposed at the central portion may be made of different materials. It is desired that each of the materials is transparent, but interfaces between different materials may be visible. Even when the interface between the materials is not visible, the materials may have a difference in composition before and/or after curing.

Referring to FIG. 17, once the first substrate 100 and the second substrate 200 have been attached together, the side surface of the first substrate 100, the side surface of the second substrate 200 and the outer portion of the sealant 400 may lie on the same plane.

Figure 18:
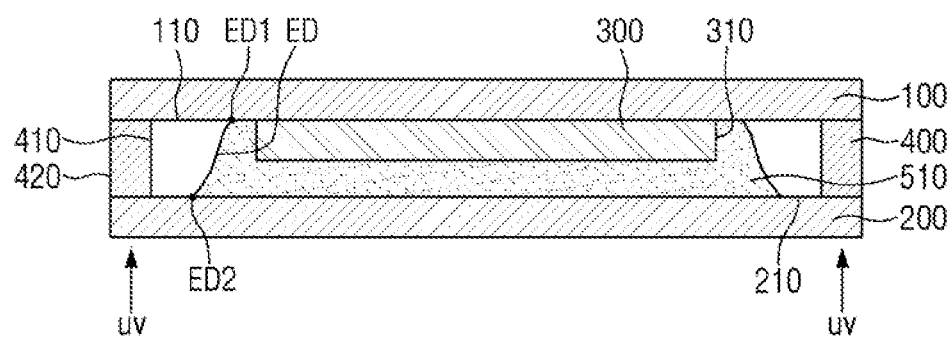
Figure 19:
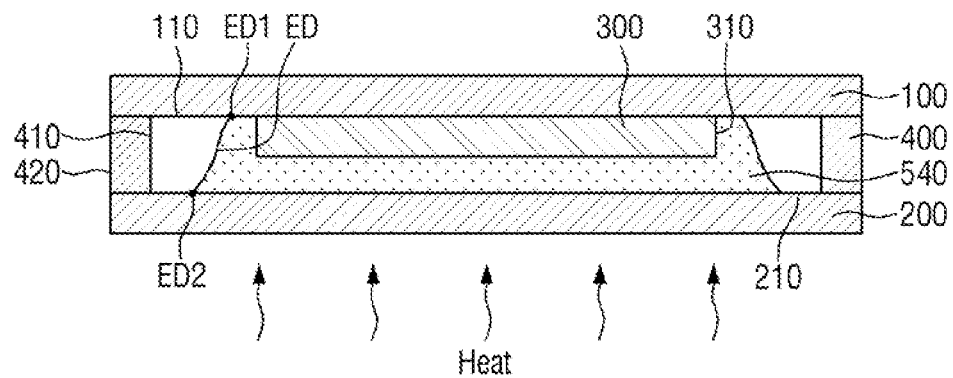

Subsequently, referring to FIGS. 9, 18 and 19, UV or laser is irradiated onto the sealant 400 to cure the sealant 400 (step S4). As described above, since the sealant 400 is cured as the sealant 400 is spaced apart from the filler 500, it is possible to prevent defects due to the contact between the sealant 400 and the filler 500 during the process of curing the sealant 400.

Subsequently, heat may be applied to the filler 500 to cure the filler 500 (step S5). According to this embodiment, the filler 500 is cured after the sealant 400 has been cured, but the disclosure is not necessarily limited thereto. For example, the sealant 400 and the filler 500 may be cured simultaneously, or the filler 500 may be cured first and then the sealant 400 may be cured.

Incidentally, although the filler 500 is applied using the jet dispenser JET in the drawings, the disclosure is not necessarily limited thereto. For example, the uncured filler 510 may be applied using various equipment such as an inkjet printer.

Figure 20:
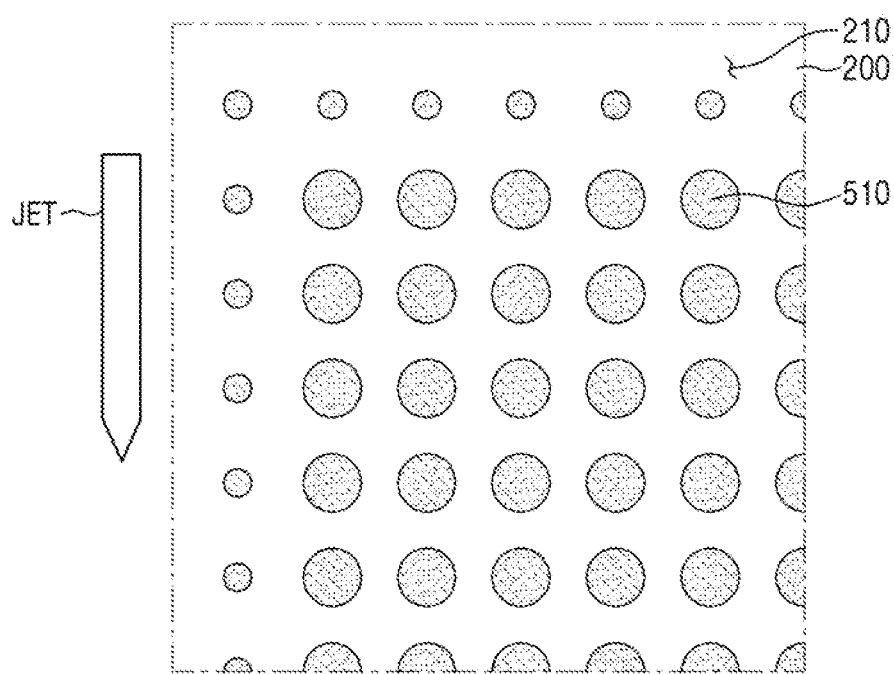
FIG. 20 is a plan view showing processing steps of a method of fabricating a display device according to an embodiment.

FIG. 20 is a view schematically showing a method of applying a filler using a jet dispenser according to an embodiment of the disclosure.

Referring to FIG. 20, the method of applying a filler using a jet dispenser JET will be described in more detail. An uncured filler 510 is thickly applied to the central portion of the space formed by the inner surface 410 of the sealant 400. Then, an uncured filler 510 is applied at an equal interval in order to apply the uncured filler 510 to the outer portion relatively thinly while adjusting the amount of the uncured filler 510 to be applied. For example, at the central portion, a nozzle having a large diameter is used or the time and/or rate of application may be increased, so that a larger amount of uncured filler 510 may be applied. At the outer portion, a nozzle having a smaller diameter is used or the time and/or rate of the application may be decreased, so that a less amount of uncured filler 510 may be applied. Although the uncured filler 510 are applied at only two different amounts in the drawings, the disclosure is not necessarily limited thereto. For example, when the uncured filler 510 is applied inside the space formed by the inner surface 410 of the sealant 400, the amount of the uncured filler 510 to be applied may be increased gradually from the outer portion to the central portion. Accordingly, the largest droplets of the uncured filler 510 may be disposed at the central portion of the space formed by the inner surface 410 of the sealant 400, while the smallest droplets of the uncured filler 510 may be disposed at the outermost position adjacent to the inner surface of the sealant 400.

Figure 21:
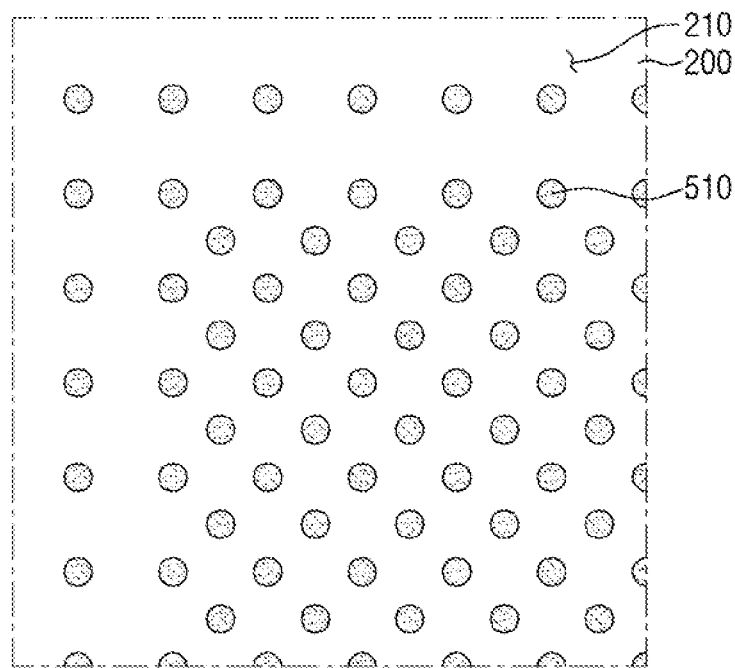
FIG. 21 is a view schematically showing a method of applying a filler using a jet dispenser according to an embodiment of the disclosure.

FIG. 21 is a view schematically showing a method of applying a filler using a jet dispenser according to an embodiment of the disclosure.

FIG. 21 shows an example where the distance between the droplets of an uncured filler 510 may vary depending on the position where the uncured filler 510 is applied. For example, when the uncured filler 510 is applied to the central portion inside the space formed by the inner surface 410 of the sealant 400, it may be applied more densely compared to the uncured filler 510 at the outer portion inside the space formed by the inner surface 410 of the sealant 400. As an example, the uncured filler 510 at the central portion in the space formed by the inner surface 410 of the sealant 400 may be applied with a spacing half the spacing of the uncured filler 510 applied at the outer portion. Alternatively, the uncured filler 510 may be first applied (first application), and then an additional uncured filler 510 may be secondarily applied to the central portion except for the outer portion (second application). As a result, a larger amount of the uncured filler 510 may be applied to the central portion than to the outer portion.

Figure 22:
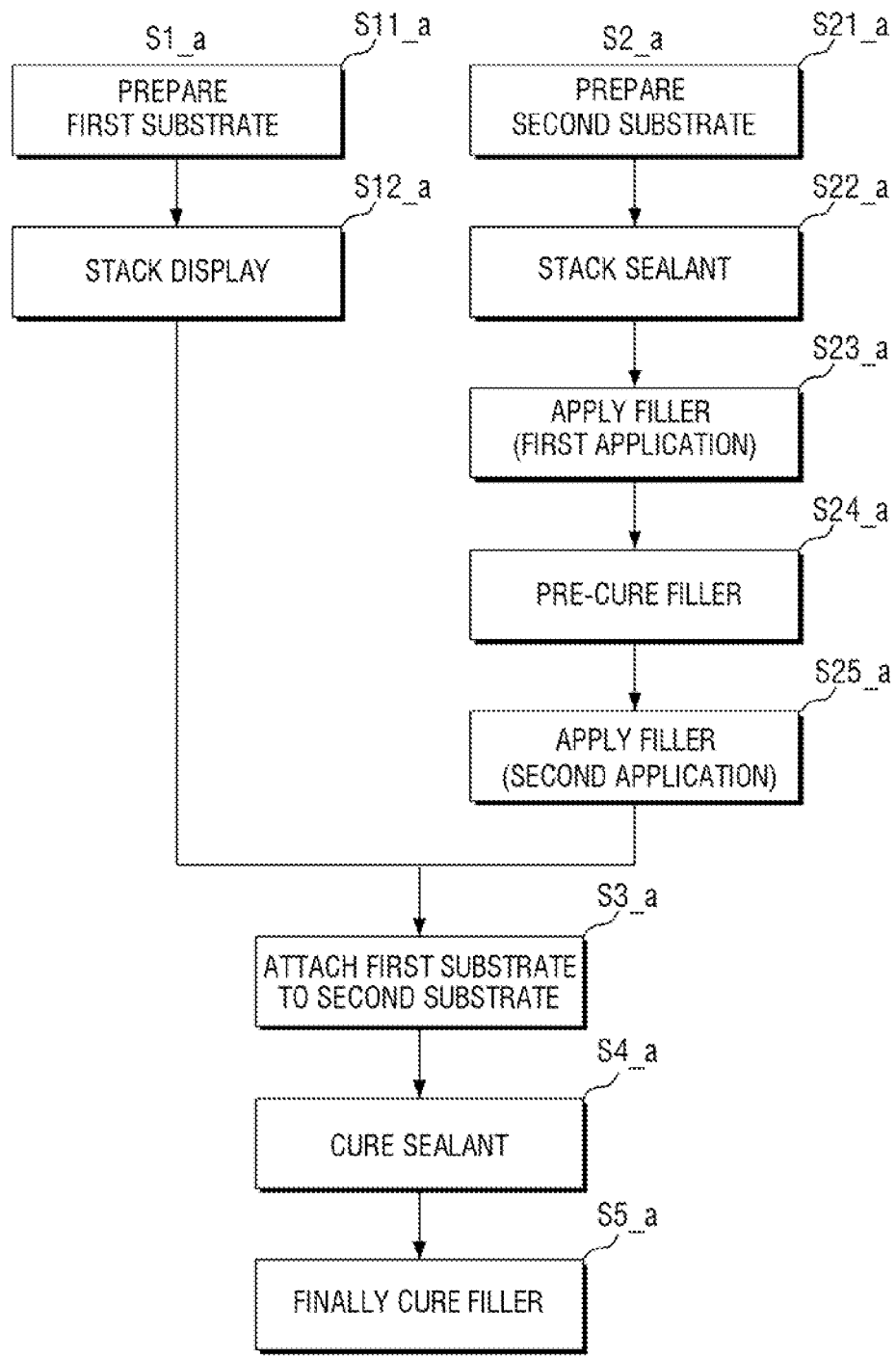
FIG. 22 is a flowchart illustrating a method of fabricating a display device according to an embodiment of the disclosure.
Figure 23:
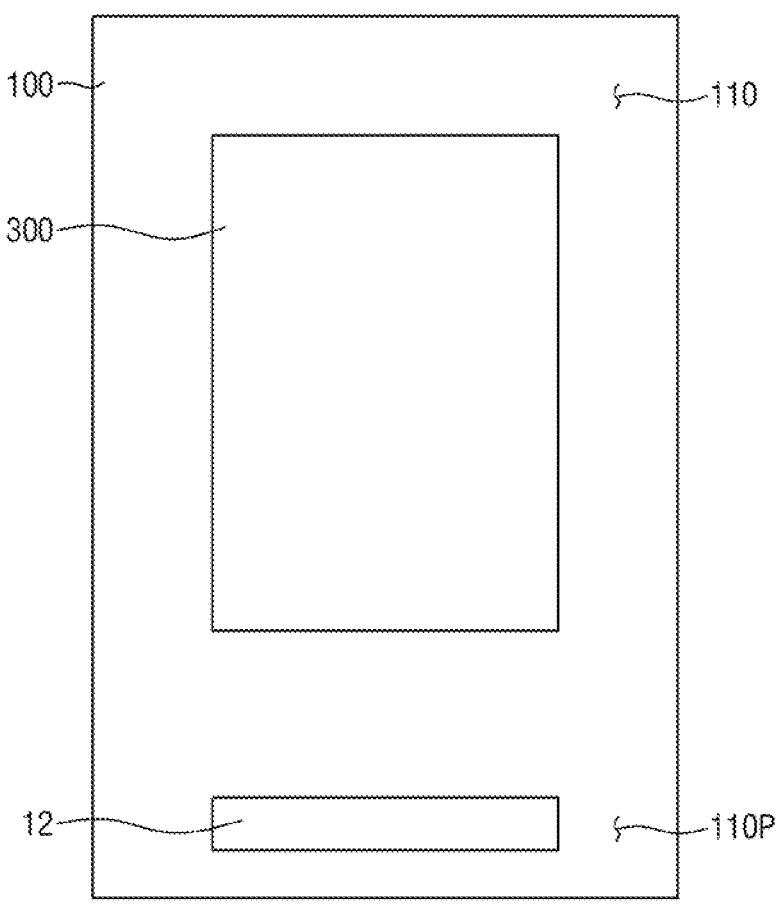
FIGS. 23 to 28 are plan views showing processing steps of a method of fabricating a display device according to an embodiment.
Figure 24:
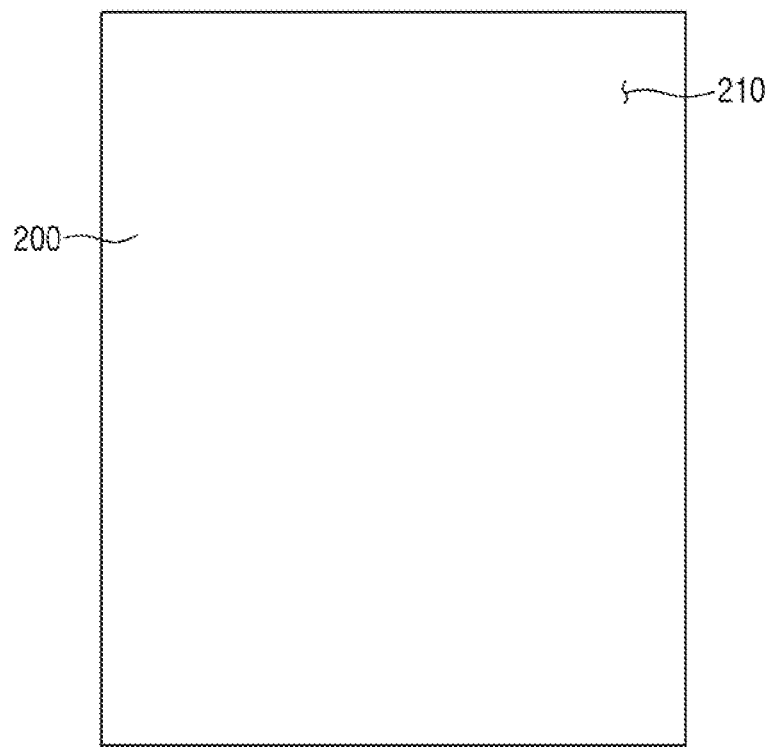
Figure 25:
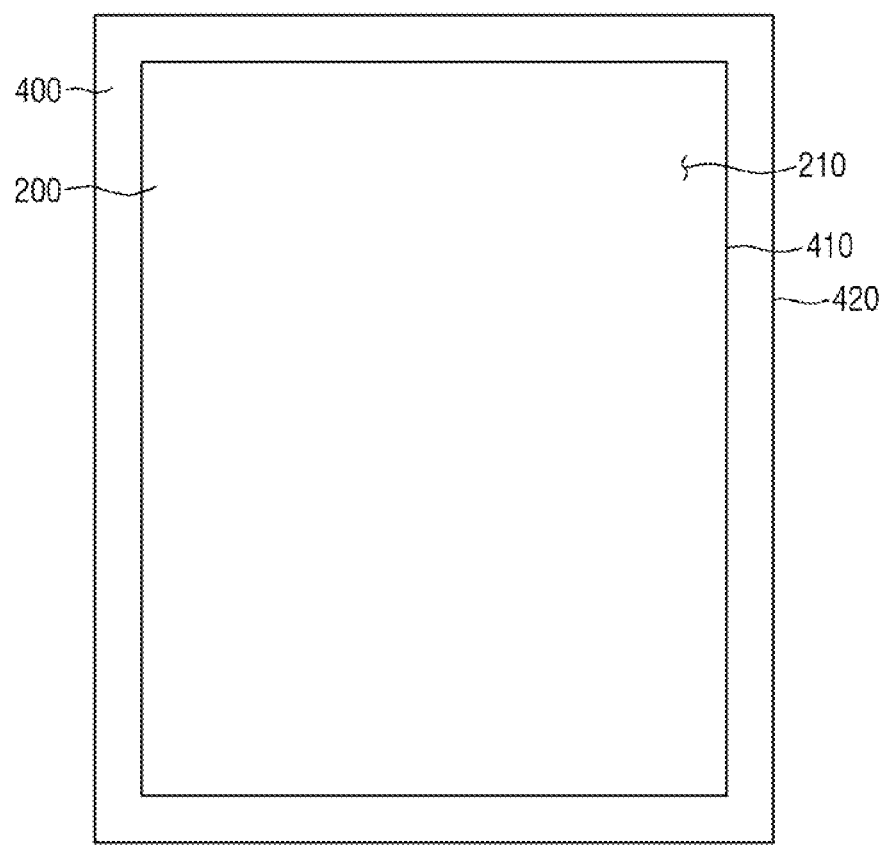
Figure 26:
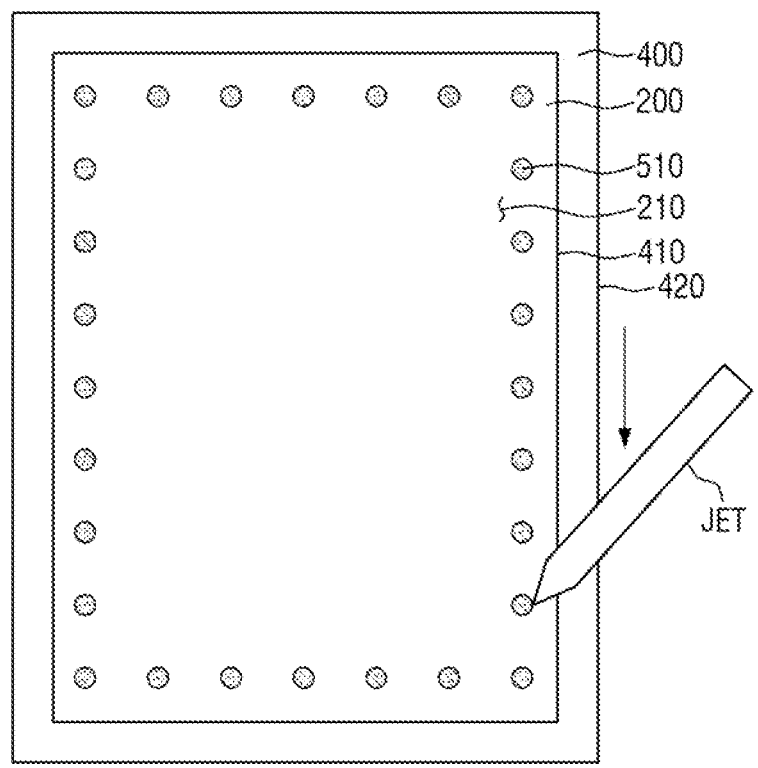

FIG. 22 is a flowchart for illustrating a method of fabricating a display device according to an embodiment of the disclosure.

Referring to FIG. 22, the method of fabricating the display device 10 may include: preparing a first substrate 100 on which a display 300 is stacked (step S1_a); preparing a second substrate 200 on which a sealant 400 and a filler 500 are stacked (step S2_a); attaching the first substrate 100 to the second substrate 200 (step S3_a); curing the sealant 400 (step S4_a); and finally curing the filler 500 (step S5_a).

One of the step S1_a of preparing the first substrate 100 on which the display 300 is stacked and the step S2_a of preparing the second substrate 200 on which the sealant 400 and the filler 500 are stacked may be carried out prior to the other or they may be carried out simultaneously.

The preparing of the first substrate 100 on which the display 300 is stacked S1_a may include preparing the first substrate 100 (step S11_a), and stacking the display 300 on the first substrate 100 (step S12_a).

The preparing of the second substrate 200 on which the sealant 400 and the filler 500 are stacked S2_a may include preparing the second substrate 200 (S21_a), stacking the sealant 400 on the second substrate 200 (S22_a), applying the filler 500 to the outer portion of the inner space of the sealant 400 (first application) (S23_a), pre-curing the filler 500 applied in the first application (step S24_a), and applying the filler 500 to an inner side of the pre-cured filler 520 (S25_a).

Although the step S5_a of finally curing the filler 500 is carried out after the step S4_a of curing the sealant 400 in the flowchart, the disclosure is not necessarily limited thereto. For example, after the step S5_a of curing the filler 500, the step S4_a of curing the sealant 400 may be carried out.

Hereinafter, a method of fabricating the display device 10 will be described in detail with reference to processing steps shown in FIGS. 23 to 32 in conjunction with the flowchart of FIG. 22.

FIGS. 23 to 32 are plan views and cross-sectional views showing processing steps of a method of fabricating a display device according to an embodiment.

Referring to FIGS. 22 and 23 to 26, the first substrate 100 may be prepared, a display 300 may be formed on a first surface 110 of the first substrate 100, a second substrate 200 may be prepared, and then a sealant 400 may be stacked on a first surface 210 of the second substrate 200. The sealant 400 may be formed along the edge of the first surface 210 of the second substrate 200. An uncured filler 510 may be first applied using a jet dispenser JET along the outer portion of the inner surface 410 of the sealant 400 (first application). The uncured filler 510 applied in the first application may be spaced apart from the inner surface 410 of the sealant 400 and may be applied along the inner surface of the sealant 400, leaving the central portion of the first surface 210 of the second substrate 200 empty (steps S1_a, S21_a, S22_a and S23_a). Accordingly, the droplets of the filler 510 that are not cured after the first application may generally form a dotted rectangular shape arranged along the inner surface 410 of the sealant 400. A reference numeral 420, which is not described above, refers to the outer surface 420 of the sealant 400.

Figure 27:
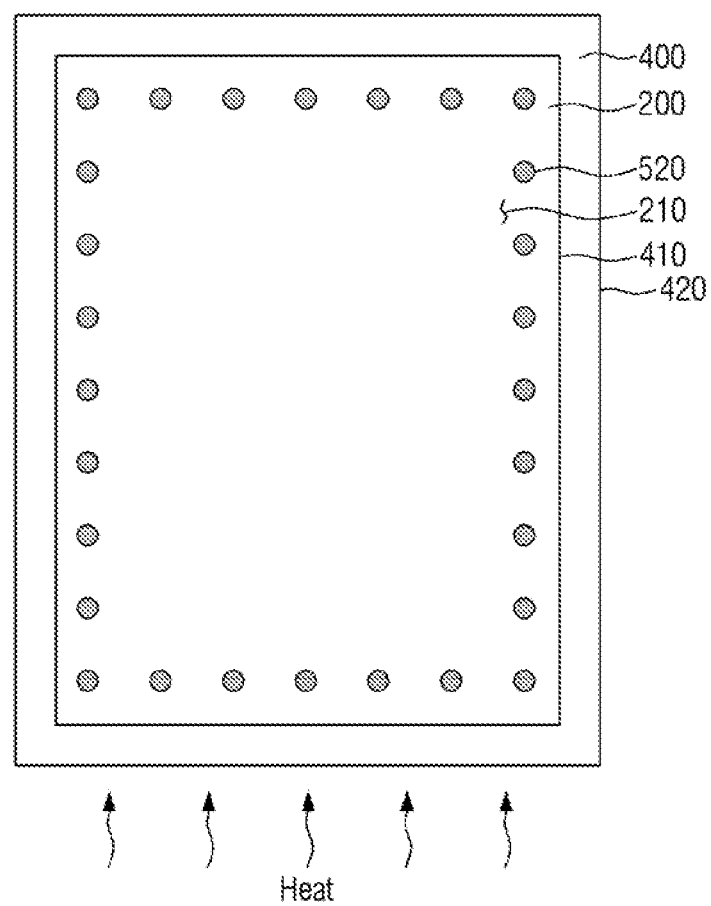
Figure 28:
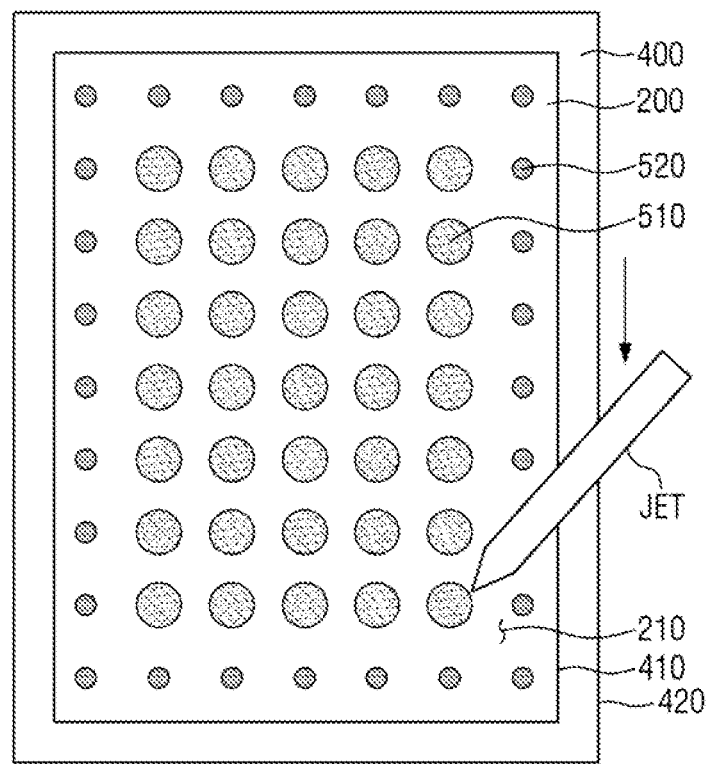

Referring to FIGS. 22, 27 and 28, by applying heat to the uncured filler 510 applied in the first application inside the inner surface 410 of the sealant 400, the uncured filler 510 can be pre-cured. In the pre-cured filler 520, cross-links may be formed between some internal molecules. As a result, the hardness of the pre-cured filler 520 may be higher than the hardness before it is pre-cured. Subsequently, the uncured filler 510 may be secondarily applied entirely on the inner surface of the pre-cured filler 520 (second application) (steps S24_a and S25_a). The amount of the uncured filler 510 to be applied may be increased in the second application compared to the first application. The size (or diameter) of each of the droplets of the uncured filler 510 applied in the second application may be larger than the size (or diameter) of the droplets of the pre-cured filler 520.

Figure 29:
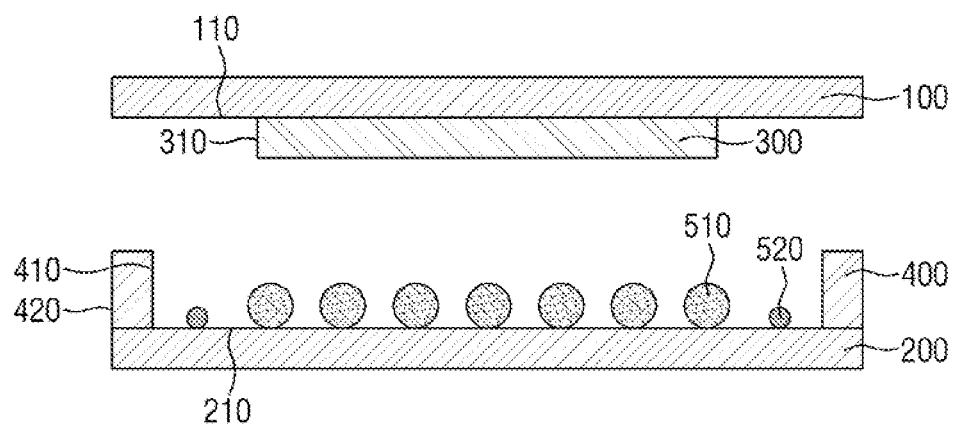
FIGS. 29 to 32 are cross-sectional views showing processing steps of a method of fabricating a display device according to an embodiment.
Figure 30:
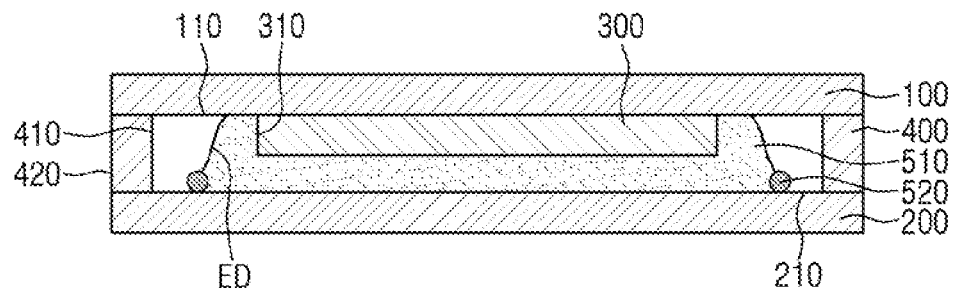

Referring to FIGS. 22, 29 and 30, the first substrate 100 may be disposed above the second substrate 200 so that the first surface 110 of the first substrate 100 faces the first surface 210 of the second substrate 200. By moving the first substrate 100 toward the second substrate 200, the first substrate 100 and the second substrate 200 may be attached together by the sealant 400. In doing so, the filler 520, which is applied in a closed curve shape along the inner surface 410 of the sealant 400 and pre-cured, may work as a dam for the uncured filler 510 applied in the second application (step S3_a).

For example, the pre-cured filler 520 is disposed at the outer portion of the inner space defined by the inner surface 410 of the sealant 400. As the first substrate 100 and the second substrate 200 are attached together, the droplets of the uncured filler 510 overlapping the display 300 come into contact with the display 300, and the droplets of the uncured filler 510 may be in contact with one another to form a mass. As the uncured filler 510 spreads in the lateral direction, the uncured filler 510 may come into contact with the pre-cured filler 520 and may spread to the space between the droplets of the pre-cured filler 520. At this time, the uncured filler 510 is still liquid, and thus it receives a force in the direction to reduce the surface area according to the surface tension. First, in the region where the uncured filler 510 overlaps with the pre-cured filler 520 along the first surface 210 of the second substrate 200, the uncured filler 510 spreading in the lateral direction comes in contact with the pre-cured filler 520 having the increased hardness, and thus it does not spread more toward the side surface. In the region where the uncured filler 510 does not overlap with the pre-cured filler 520 along the first surface 210 of the second substrate 200, the spacing between the droplets of the pre-cured filler 520 is narrow, and thus the surface area of the uncured filler 510 may increase is the uncured filler 510 spreads between the droplets of the pre-cured filler 520. Accordingly, the uncured filler 510 receives a force in the opposite direction to the direction between the droplets of the pre-cured filler 520 inside the mass of the uncured filler 510. Therefore, the uncured filler 510 is restricted from spreading in the lateral direction, and thus the uncured filler 510 does not spread to the space between the droplets of the pre-cured filler 520.

Thus, the pre-cured filler 520 may work as a dam, so that the uncured filler 510 does not overflow beyond the pre-cured filler 520 but stays on the inner side of it. Accordingly, it is possible to prevent the contact between the uncured filler 510 and the sealant 400. In this manner, even when the filler 500 having a low viscosity is used, the inner space can be filled with the filler 500 without a dam.

In addition, as mentioned above, the outer portion of the first substrate 100 where the display 300 is not disposed has a larger space between the first surface 210 of the second substrate 200 and the first surface 110 of the first substrate 100 than the central portion where the display 300 is disposed. The space between the first surface 210 of the second substrate 200 and the first surface 110 of the first substrate 100 cannot be filled with a smaller amount of the pre-cured filler 520. In addition, the pre-cured filler 520 is applied on the first surface 210 of the second substrate 200. Therefore, the pre-cured filler 520 is in contact with the first surface 210 of the second substrate 200 while it is spaced apart from the first surface 110 of the first substrate 100 at the outer portion. As a result, the edge ED of the filler 500 formed by the pre-cured filler 520 and the uncured filler 510 may slope downward toward the first surface 110 of the first substrate 100 from the first surface 210 of the second substrate 200. Referring to FIG. 30, once the first substrate 100 and the second substrate 200 have been attached together, the side surface of the first substrate 100, the side surface of the second substrate 200 and the outer portion of the sealant 400 may lie on the same plane.

Figure 31:
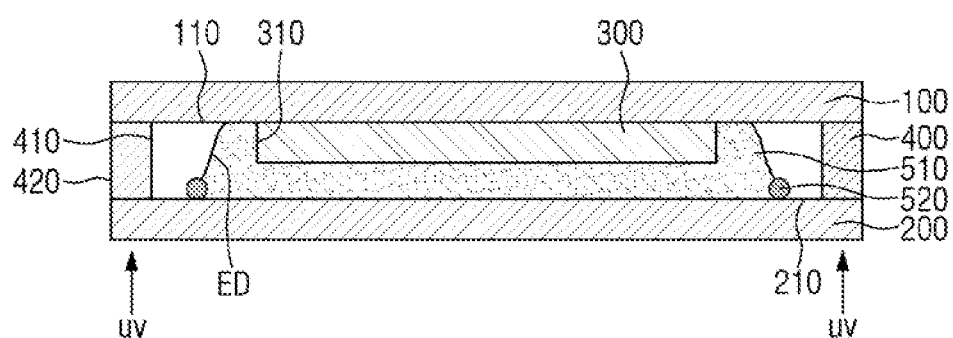
Figure 32:
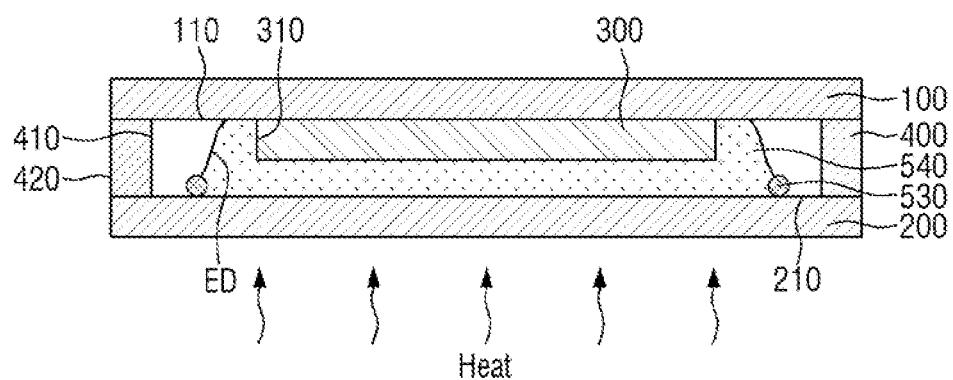

Referring to FIGS. 22, 31 and 32, the sealant 400 is cured by ultraviolet light, laser, etc., and heat may be applied to the uncured filler 510 and the pre-cured filler 520, so that the uncured filler 510 and the pre-cured filler 520 may be finally cured (final curing) (steps S4_a and S5_a). The pre-cure filler 520 as well as the uncured filler 500 can be completely cured by the final curing. In the foregoing description, the sealant 400 is cured and then the uncured filler 510 and the pre-cured filler 520 are finally cured. It should be understood, however, that the disclosure is not necessarily limited thereto. For example, the uncured filler 510 and the pre-cured filler 520 may be finally cured first, and then the sealant 400 may be cured.

Figure 33:
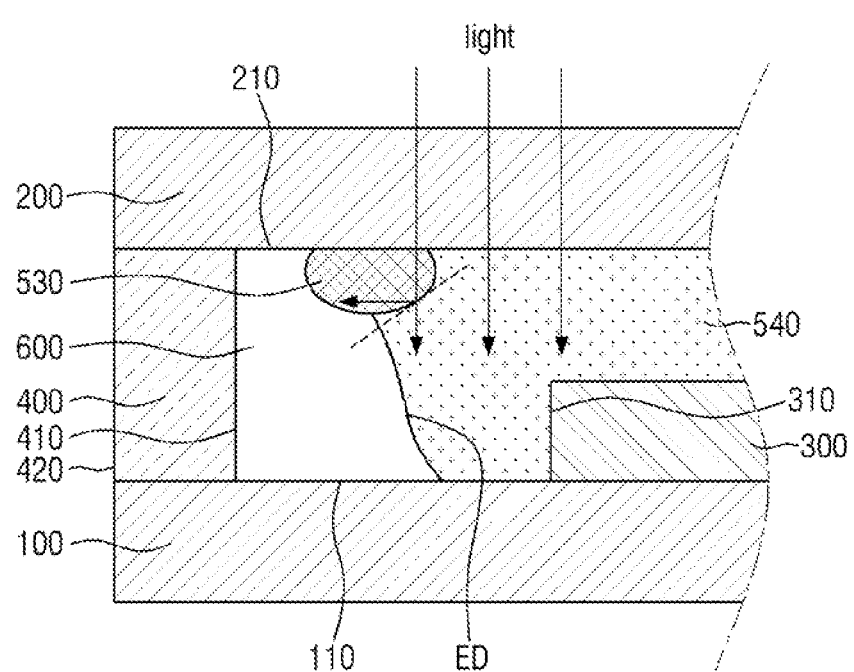
FIG. 33 is a cross-sectional view of a part of a display device according to an embodiment of the disclosure.

FIG. 33 is a cross-sectional view of a part of a display device according to an embodiment of the disclosure.

In some embodiments, the uncured filler 510 may be first applied on the first surface 210 of the second substrate 200 and may be pre-cured. Accordingly, the finally cured filler 530 after the pre-curing may be disposed on the first surface 210 of the second substrate 200. A finally cured filler 540 without the pre-curing may be disposed in contact with the finally-cured filler 530 after the pre-curing, the second substrate 200, the display 300, the first surface 110 of the first substrate 100 and the empty space 600. In addition, the finally-cured filler 530 after the pre-curing and/or the finally-cured filler 540 without the pre-curing may be inclined with respect to the first surface 210 of the second substrate 200.

The number of cross-links or molecular structure of the finally-cured filler 530 after the pre-curing might not be the same as those of the finally-cured filler 540 without the pre-curing. Accordingly, the finally-cured filler 530 after the pre-curing and the finally-cured filler 540 without the pre-curing may have different physical and chemical properties Accordingly, the interface between the finally-cured filler 530 after the pre-curing and the finally-cured filler 540 without the pre-curing may exhibit various characteristics different from other portions. For example, the second substrate 200 may be made of a transparent material so that light can pass therethrough. The light incident through the second substrate 200 may pass through the finally-cured filler 530 after the pre-curing and the finally-cured filler 540 without the pre-curing. The interface between the finally-cured filler 530 after the pre-curing and the finally-cured filler 540 without the pre-curing may exhibit a different reflectance from the reflectances of other portions.

Features of various embodiments of the disclosure may be combined partially or totally. As will be clearly appreciated by those skilled in the art, technically various interactions and operations are possible. Various embodiments can be practiced individually or in combination.

In concluding the detailed description, those skilled in the art will appreciate that many variations and modifications can be made to the preferred embodiments without substantially departing from the principles of the invention.

What is claimed is:
1. A display device, comprising:
  a first substrate;
  a second substrate disposed on the first substrate;
  a display disposed on the first substrate, the display including a plurality of pixels configured to emit light of multiple colors;

a sealant disposed between the first substrate and the second substrate along an outer portion of the second substrate, the sealant attaching the first substrate to the second substrate; and a filler disposed in a space defined by the first substrate, the second substrate, and the sealant, such that the filler is disposed between the plurality of pixels of the display and the second substrate, wherein the filler is spaced apart from an inner surface of the sealant with an empty space disposed therebetween, wherein an edge of the filler is inclined with respect to a first surface of the first substrate and a first surface of the second substrate, wherein the edge of the filler inclined with respect to the first surface of the first substrate comprises a first curved extension protruding in a direction toward the sealant, wherein the edge of the filler inclined with respect to the first surface of the second substrate comprises a second curved extension protruding in a direction opposite to the direction toward the sealant, and wherein the filler directly contacts a top surface of the display and side surfaces of the display such that the filler encapsulates the display against the first substrate such that the display is not exposed to the empty space between the filler and the sealant.

2. The display device of claim 1, wherein the edge of the filler comprises a first edge that is in contact with a first surface of the first substrate and a second edge that is in contact with the first surface of the second substrate, and
wherein a distance between the inner surface of the sealant and the first edge is greater than a distance between the inner surface of the sealant and the second edge.

3. The display device of claim 2, wherein each of the first edge and the second edge of the filler has a closed curved shape, and wherein the first edge is disposed closer to a center of the display device than is the second edge.

4. The display device of claim 3, wherein the first edge and the second edge each have a uniform distance along a border of the filler.

5. The display device of claim 2, wherein, in a plan view, the second edge comprises a curved extension, wherein an offset of the curved extension is greater than an offset of the inner surface of the sealant adjacent thereto.

6. The display device of claim 1, wherein the empty space is in a vacuum state, is filled with a gas, or is an air gap.

7. The display device of claim 1, wherein the filler has a viscosity equal to or greater than 10,000 cP.

8. A display device, comprising:
a first substrate;
a second substrate disposed on the first substrate;
a display disposed on the first substrate, the display including a plurality of pixels configured to emit light of multiple colors;
a filler disposed between the first substrate and the second substrate and covering the display and surrounding a side surface of the display such that the filler is disposed between the plurality of pixels of the display and the second substrate; and a sealant disposed between the first substrate and the second substrate and surrounding the filler, wherein an edge of the filler comprises a first edge in contact with the first substrate and a second edge in contact with the second substrate, wherein the first edge is disposed closer to a center of the display device than is the second edge, wherein the second edge is spaced apart from the sealant, wherein the first edge comprises a first curved extension protruding in a direction toward the sealant, wherein the second edge comprises a second curved extension protruding in a direction opposite to the direction toward the sealant, and wherein the filler directly contacts a top surface of the display and side surfaces of the display such that the filler encapsulates the display against the first substrate such that the display is not exposed to a space between the second edge of the filler and the sealant.

9. The display device of claim 8, wherein the space between the second edge of the filler and the sealant is in a vacuum state, is filled with a gas, or is an air gap.

10. The display device of claim 9, wherein, in a plan view, the second edge comprises a curved extension, wherein an offset of the curved extension is greater than an offset of an inner surface of the sealant adjacent thereto.

11. An electronic device, comprising:
a first substrate;
a second substrate disposed on the first substrate;
a display disposed on the first substrate, the display including a plurality of pixels configured to emit light of multiple colors;
a sealant disposed between the first substrate and the second substrate along an outer portion of the second substrate, the sealant attaching the first substrate to the second substrate; and
a filler disposed in a space defined by the first substrate, the second substrate, and the sealant, such that the filler is disposed between the plurality of pixels of the display and the second substrate, wherein the filler is spaced apart from an inner surface of the sealant with an empty space disposed therebetween, wherein an edge of the filler is inclined with respect to a first surface of the first substrate and a first surface of the second substrate, wherein the edge of the filler inclined with respect to the first surface of the first substrate comprises a first curved extension protruding in a direction toward the sealant, wherein the edge of the filler inclined with respect to the first surface of the second substrate comprises a second curved extension protruding in a direction opposite to the direction toward the sealant, and wherein the filler directly contacts a top surface of the display and side surfaces of the display such that the filler encapsulates the display against the first substrate such that the display is not exposed to the empty space between the filler and the sealant.

* * * * *